United States Patent
Westhoff et al.

(10) Patent No.: US 7,332,417 B2
(45) Date of Patent: Feb. 19, 2008

(54) SEMICONDUCTOR STRUCTURES WITH STRUCTURAL HOMOGENEITY

(75) Inventors: Richard Westhoff, Hudson, NH (US); Christopher J. Vineis, Cambridge, MA (US); Matthew T. Currie, Windham, NH (US); Vicky T. Yang, Windham, NH (US); Christopher W. Leitz, Manchester, NH (US)

(73) Assignee: AmberWave Systems Corporation, Salem, NH (US)

( * ) Notice: Subject to any disclaimer, the term of this patent is extended or adjusted under 35 U.S.C. 154(b) by 73 days.

(21) Appl. No.: 10/765,372

(22) Filed: Jan. 27, 2004

(65) Prior Publication Data

US 2004/0214407 A1 Oct. 28, 2004

Related U.S. Application Data

(60) Provisional application No. 60/422,784, filed on Jan. 27, 2003.

(51) Int. Cl.
*H01L 21/20* (2006.01)
*H01L 21/36* (2006.01)
*H01L 21/30* (2006.01)

(52) U.S. Cl. ............... 438/509; 438/455; 257/E21.097

(58) Field of Classification Search ............... 438/796, 438/797, 509; 257/E21.097
See application file for complete search history.

(56) References Cited

U.S. PATENT DOCUMENTS

| | | |
|---|---|---|
| 4,010,045 A | 3/1977 | Ruehrwein |
| 4,710,788 A | 12/1987 | Dambkes et al. |
| 4,900,372 A | 2/1990 | Lee et al. |
| 4,914,488 A | 4/1990 | Yamane et al. |
| 4,960,728 A | 10/1990 | Schaake et al. |
| 4,987,462 A | 1/1991 | Kim et al. |
| 4,990,979 A | 2/1991 | Otto |
| 4,997,776 A | 3/1991 | Harame et al. |
| 5,013,681 A | 5/1991 | Godbey et al. |
| 5,091,767 A | 2/1992 | Bean et al. |
| 5,097,630 A | 3/1992 | Maeda et al. |
| 5,155,571 A | 10/1992 | Wang et al. |
| 5,159,413 A | 10/1992 | Calviello et al. |
| 5,166,084 A | 11/1992 | Pfiester |
| 5,177,583 A | 1/1993 | Endo et al. |
| 5,202,284 A | 4/1993 | Kamins et al. |
| 5,207,864 A | 5/1993 | Bhat et al. |
| 5,208,182 A | 5/1993 | Narayan et al. |
| 5,210,052 A | 5/1993 | Takasaki |

(Continued)

FOREIGN PATENT DOCUMENTS

DE 41 01 167 7/1992

(Continued)

OTHER PUBLICATIONS

International Search Report for International Application No. PCT/US2004/002282 Oct. 15, 2004.

(Continued)

*Primary Examiner*—Matthew Smith
(74) *Attorney, Agent, or Firm*—Goodwin Procter LLP

(57) ABSTRACT

Semiconductor structures are formed with semiconductor layers having reduced compositional variation. Top surfaces of the semiconductor layers are substantially haze-free.

34 Claims, 10 Drawing Sheets

U.S. PATENT DOCUMENTS

| | | |
|---|---|---|
| 5,212,110 A | 5/1993 | Pfiester et al. |
| 5,218,417 A * | 6/1993 | Gay et al. .................. 356/300 |
| 5,221,413 A | 6/1993 | Brasen et al. |
| 5,240,876 A | 8/1993 | Gaul et al. |
| 5,241,197 A | 8/1993 | Murakami et al. |
| 5,250,445 A | 10/1993 | Bean et al. |
| 5,252,173 A | 10/1993 | Inoue |
| 5,279,687 A | 1/1994 | Tuppen et al. |
| 5,285,086 A | 2/1994 | Fitzgerald |
| 5,291,439 A | 3/1994 | Kauffmann et al. |
| 5,298,452 A | 3/1994 | Meyerson |
| 5,308,444 A | 5/1994 | Fitz et al. |
| 5,310,451 A | 5/1994 | Tejwani et al. |
| 5,316,958 A | 5/1994 | Meyerson |
| 5,346,848 A | 9/1994 | Grupen-Shemansky et al. |
| 5,374,564 A | 12/1994 | Bruel |
| 5,399,522 A | 3/1995 | Ohori |
| 5,413,679 A | 5/1995 | Godbey |
| 5,415,128 A * | 5/1995 | Kao et al. ..................... 117/98 |
| 5,424,243 A | 6/1995 | Takasaki |
| 5,425,846 A | 6/1995 | Koze et al. |
| 5,426,069 A | 6/1995 | Selvakumar et al. |
| 5,426,316 A | 6/1995 | Mohammad |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitahara et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,572,043 A | 11/1996 | Shimizu et al. |
| 5,596,527 A | 1/1997 | Tomioka et al. |
| 5,617,351 A | 4/1997 | Bertin et al. |
| 5,630,905 A | 5/1997 | Lynch et al. |
| 5,633,516 A | 5/1997 | Mishima et al. |
| 5,659,187 A | 8/1997 | Legoues et al. |
| 5,683,934 A | 11/1997 | Candelaria |
| 5,698,869 A | 12/1997 | Yoshimi et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. |
| 5,792,679 A | 8/1998 | Nakato |
| 5,801,085 A | 9/1998 | Kim et al. |
| 5,808,344 A | 9/1998 | Ismail et al. |
| 5,810,924 A | 9/1998 | Legoues et al. |
| 5,828,114 A | 10/1998 | Kim et al. |
| 5,844,260 A * | 12/1998 | Ohori .......................... 257/190 |
| 5,847,419 A | 12/1998 | Imai et al. |
| 5,859,864 A | 1/1999 | Jewell |
| 5,877,070 A | 3/1999 | Goesele et al. |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,943,560 A | 8/1999 | Chang et al. |
| 5,963,817 A | 10/1999 | Chu et al. |
| 5,966,622 A | 10/1999 | Levine et al. |
| 5,998,807 A | 12/1999 | Lustig et al. |
| 6,010,937 A | 1/2000 | Karam et al. |
| 6,013,134 A | 1/2000 | Chu et al. |
| 6,030,884 A | 2/2000 | Mori |
| 6,033,974 A | 3/2000 | Henley et al. |
| 6,033,995 A | 3/2000 | Muller |
| 6,039,803 A | 3/2000 | Fitzgerald et al. |
| 6,058,044 A | 5/2000 | Sugiura et al. |
| 6,059,895 A | 5/2000 | Chu et al. |
| 6,074,919 A | 6/2000 | Gardner et al. |
| 6,096,590 A | 8/2000 | Chan et al. |
| 6,103,559 A | 8/2000 | Gardner et al. |
| 6,107,653 A | 8/2000 | Fitzgerald |
| 6,111,267 A | 8/2000 | Fischer et al. |
| 6,117,750 A | 9/2000 | Bensahel et al. |
| 6,124,617 A | 9/2000 | Ryum et al. |
| 6,130,453 A | 10/2000 | Mei et al. |
| 6,133,799 A | 10/2000 | Favors et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,160,303 A | 12/2000 | Fattaruso |
| 6,162,688 A | 12/2000 | Gardner et al. |
| 6,184,111 B1 | 2/2001 | Henley et al. |
| 6,191,006 B1 | 2/2001 | Mori |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,208,005 B1 | 3/2001 | Mitra |
| 6,210,988 B1 | 4/2001 | Howe et al. |
| 6,218,677 B1 | 4/2001 | Broekaert |
| 6,232,138 B1 | 5/2001 | Fitzgerald et al. |
| 6,235,560 B1 * | 5/2001 | Ma et al. ..................... 438/150 |
| 6,235,567 B1 | 5/2001 | Huang |
| 6,242,324 B1 | 6/2001 | Kub et al. |
| 6,249,022 B1 | 6/2001 | Lin et al. |
| 6,251,755 B1 | 6/2001 | Furukawa et al. |
| 6,261,929 B1 | 7/2001 | Gehrke et al. |
| 6,266,278 B1 | 7/2001 | Harari et al. |
| 6,271,551 B1 | 8/2001 | Schmitz et al. |
| 6,271,726 B1 | 8/2001 | Fransis et al. |
| 6,291,321 B1 | 9/2001 | Fitzgerald |
| 6,313,016 B1 | 11/2001 | Kibbel et al. |
| 6,316,301 B1 | 11/2001 | Kant |
| 6,323,108 B1 | 11/2001 | Kub et al. |
| 6,329,063 B2 | 12/2001 | Lo et al. |
| 6,335,269 B1 * | 1/2002 | Sato .......................... 438/509 |
| 6,335,546 B1 | 1/2002 | Tsuda et al. |
| 6,339,232 B1 | 1/2002 | Takagi |
| 6,350,993 B1 | 2/2002 | Chu et al. |
| 6,352,909 B1 | 3/2002 | Usenko |
| 6,368,733 B1 | 4/2002 | Nishinaga |
| 6,372,356 B1 | 4/2002 | Thornton et al. |
| 6,399,970 B2 | 6/2002 | Kubo et al. |
| 6,403,975 B1 | 6/2002 | Brunner et al. |
| 6,406,589 B1 | 6/2002 | Yanagisawa |
| 6,407,406 B1 | 6/2002 | Tezuka |
| 6,420,937 B1 | 7/2002 | Akatsuka et al. |
| 6,425,951 B1 | 7/2002 | Chu et al. |
| 6,429,061 B1 | 8/2002 | Rim |
| 6,482,749 B1 | 11/2002 | Billington et al. |
| 6,515,335 B1 | 2/2003 | Christiansen et al. |
| 6,518,644 B2 | 2/2003 | Fitzgerald |
| 6,521,041 B2 | 2/2003 | Wu et al. |
| 6,524,935 B1 | 2/2003 | Canaperi et al. |
| 6,525,338 B2 | 2/2003 | Mizushima et al. |
| 6,555,839 B2 | 4/2003 | Fitzgerald |
| 6,573,126 B2 | 6/2003 | Cheng et al. |
| 6,576,532 B1 | 6/2003 | Jones et al. |
| 6,583,015 B2 | 6/2003 | Fitzgerald et al. |
| 6,593,191 B2 | 7/2003 | Fitzgerald |
| 6,594,293 B1 | 7/2003 | Bulsara et al. |
| 6,602,613 B1 | 8/2003 | Fitzgerald |
| 6,646,322 B2 | 11/2003 | Fitzgerald |

| | | |
|---|---|---|
| 6,649,480 B2 | 11/2003 | Fitzgerald et al. |
| 6,677,192 B1 | 1/2004 | Fitzgerald |
| 6,703,144 B2 | 3/2004 | Fitzgerald |
| 6,703,688 B1 | 3/2004 | Fitzgerald |
| 6,709,903 B2 | 3/2004 | Christiansen |
| 6,713,326 B2 | 3/2004 | Cheng et al. |
| 6,723,661 B2 | 4/2004 | Fitzgerald |
| 6,724,008 B2 | 4/2004 | Fitzgerald |
| 6,730,551 B2 | 5/2004 | Lee et al. |
| 6,737,670 B2 | 5/2004 | Cheng et al. |
| 6,750,130 B1 | 6/2004 | Fitzgerald |
| 6,767,802 B1 * | 7/2004 | Maa et al. ............. 438/406 |
| 6,841,457 B2 * | 1/2005 | Bedell et al. ........... 438/479 |
| 2001/0003364 A1 | 6/2001 | Sugawara et al. |
| 2001/0014570 A1 | 8/2001 | Wenski et al. |
| 2002/0043660 A1 | 4/2002 | Yamazaki et al. |
| 2002/0084000 A1 | 7/2002 | Fitzgerald |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123183 A1 | 9/2002 | Fitzgerald |
| 2002/0125471 A1 | 9/2002 | Fitzgerald et al. |
| 2002/0146892 A1 * | 10/2002 | Notsu et al. ............. 438/455 |
| 2002/0168802 A1 * | 11/2002 | Hsu et al. ............... 438/149 |
| 2002/0168864 A1 | 11/2002 | Cheng et al. |
| 2002/0185686 A1 | 12/2002 | Christiansen et al. |
| 2003/0003679 A1 | 1/2003 | Doyle et al. |
| 2003/0013323 A1 | 1/2003 | Hammond et al. |
| 2003/0034529 A1 | 2/2003 | Fitzgerald et al. |
| 2003/0041798 A1 | 3/2003 | Wenski et al. |
| 2003/0057439 A1 | 3/2003 | Fitzgerald |
| 2003/0102498 A1 | 6/2003 | Braithwaite et al. |
| 2003/0159644 A1 * | 8/2003 | Yonehara et al. ............ 117/8 |
| 2003/0199126 A1 | 10/2003 | Chu et al. |
| 2003/0203600 A1 | 10/2003 | Chu et al. |
| 2003/0215990 A1 | 11/2003 | Fitzgerald et al. |
| 2003/0218189 A1 | 11/2003 | Christiansen |
| 2003/0227057 A1 | 12/2003 | Lochtefeld et al. |
| 2004/0005740 A1 | 1/2004 | Lochtefeld et al. |
| 2004/0014304 A1 | 1/2004 | Bhattacharyya |
| 2004/0031979 A1 | 2/2004 | Lochtefeld |
| 2004/0041210 A1 | 3/2004 | Mouli |
| 2004/0060518 A1 * | 4/2004 | Nakamura et al. .......... 118/724 |
| 2004/0067644 A1 * | 4/2004 | Malik et al. ............. 438/689 |
| 2004/0075149 A1 | 4/2004 | Fitzgerald et al. |
| 2004/0137698 A1 * | 7/2004 | Taraschi et al. ........... 438/458 |

FOREIGN PATENT DOCUMENTS

| | | |
|---|---|---|
| EP | 0 514 018 | 11/1992 |
| EP | 0 587 520 | 3/1994 |
| EP | 0 683 522 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| GB | 2 342 777 | 4/2000 |
| JP | 61-141116 | 6/1986 |
| JP | 2-210816 | 8/1990 |
| JP | 3-36717 | 2/1991 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-94420 | 4/1995 |
| JP | 7-106446 | 4/1995 |
| JP | 7-240372 | 9/1995 |
| JP | 10-270685 | 10/1998 |
| JP | 11-233744 | 8/1999 |
| JP | 2000-021783 | 1/2000 |
| JP | 2000-031491 | 1/2000 |
| JP | 2000-513507 | 10/2000 |
| JP | 2001-319935 | 11/2001 |
| JP | 2002-076334 | 3/2002 |
| JP | 2002-164520 | 6/2002 |
| JP | 2002-289533 | 10/2002 |
| JP | 2002-356399 | 12/2002 |
| WO | 98/59365 | 12/1998 |
| WO | 99/53539 | 10/1999 |
| WO | 00/48239 | 8/2000 |
| WO | 00/54338 | 9/2000 |
| WO | 01/22482 | 3/2001 |
| WO | 01/54175 | 7/2001 |
| WO | 01/54202 | 7/2001 |
| WO | 01/93338 | 12/2001 |
| WO | 01/99169 | 12/2001 |
| WO | 02/13262 | 2/2002 |
| WO | 02/15244 | 2/2002 |
| WO | 02/27783 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 | 10/2002 |
| WO | 03/015140 | 2/2003 |
| WO | 2004/006311 | 1/2004 |
| WO | 2004/006327 | 1/2004 |

OTHER PUBLICATIONS

Armstrong et al., "design of Si/SiGe Heterojunction Complementary Metal-Oxide-Semiconductor Transistors," *IEDM Technical Digest* (1995 International Electron Devices Meeting), pp. 761-764.

Armstrong, "Technology for SiGe Heterostructure-based CMOS Devices," PhD Thesis, Massachusetts Institute of Technology, 1999, pp. 1-154.

Augusto et al., "Proposal for a New Process Flow for the Fabrication of Silicon-Based Complementary MOD-MOSFETs without Ion Implantation," *Thin Solid Films*, vol. 294, No. 1-2 (Feb. 15, 1997), pp. 254-258.

Barradas et al., "RBS analysis of MBE-grown SiGe/(001) Si heterostructures with thin, high Ge content SiGe channels for HMOS transistors," *Modern Physics Letters B*, vol. 15 (2001), abstract.

Borenstein et al., "A New Ultra-Hard Etch-Stop Layer for High Precision Micromachining," Proceedings of the 1999 12th IEEE International Conference on Micro Electro Mechanical Systems (MEMs) (Jan. 17-21, 1999), pp. 205-210.

Bouillon et al., "Search for the optimal channel architecture for 0.18/0.12 μm bulk CMOS experimental study," *IEEE* (1996), pp. 21.2.1-21.2.4.

Bruel et al., "®SMART CUT: A Promising New SOI Material Technology," Proceedings of the 1995 IEEE International SOI Conference (Oct. 1995), pp. 178-179.

Bruel, "Silicon on Insulator Material Technology," *Electronic Letters*, vol. 13, No. 14 (Jul. 6, 1995), pp. 1201-1202.

Bufler et al., "Hole transport in strained Si1-xGex alloys on $Si_{1-y}Ge_y$ substrates," *Journal of Applied Physics*, vol. 84, No. 10 (Nov. 15, 1998), pp. 5597-5602.

Bulsara, "Materials Issues with the Integration of Lattice-Mismatched $In_xGa_{1-x}As$ on GaAs," PhD Thesis, MIT, Jun. 1998, pp. 1-178.

Bulsara at al., "Relaxed $In_xGa_{1-x}As$ graded buffers grown with organometallic vapor phase epitaxy on GaAs," *Applied Physics Letters*, vol. 72, No. 13 (Mar. 30, 1998), pp. 1608-1610.

Burghartz et al., "Microwave Inductors and Capacitors in Standard Multilevel Interconnect Silicon Technology," *IEEE Transactions on Microwave Theory and Techniques*, vol. 44, No. 1 (Jan. 1996), pp. 100-104.

Buttard et al., "Toward Two-Dimensional Self-Organization of Nanostructures Using Wafer Bonding and Nanopatterned Silicon Surfaces," *IEEE—2002 Journal of Quantum Electronics*, vol. 38, Issue 8 (Aug. 2002), pp. 995-1005.

Canaperi et al., "Preparation of a relaxed Si-Ge layer on an insulator in fabricating high-speed semiconductor devices with strained epitaxial films," International Business Machines Corporation, USA (2002), abstract.

Carlin et al., "High Efficiency GaAs-on-Si Solar Cells with High Voc using Graded Gesi Buffers," *IEEE—2000* (2000), pp. 1006-1011.

Carlin et al., "Investigation and Development of High Quality GaAs-on-Si for Space Photovoltaics Using a Graded GeSi," PhD Thesis, Ohio State University, 2001, pp. 1-232.

Chang et al., "Selective Etching of SiGe/Si Heterostructures," *Journal of the Electrochemical Society*, No. 1 (Jan. 1991), pp. 202-204.

Charasse et al., "MBE Growth of GaAs on Si at Thomson," *IEE Colloquium on GaAs on Si*, (Mar. 8, 1988), pp. 1-4.

Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001), pp. 321-323.

Cheng et al., "Relaxed Silicon-Germanium on Insulator Substrate by Layer Transfer," *Journal of Electronic Materials*, vol. 30, No. 12 (2001), pp. L37-L39.

Crumbaker et al., "The Influence of Dislocation Density on Electron Mobility in InP Films on Si," *Applied Physics Letters*, vol. 59, Issue 9 (Aug. 26, 1991), pp. 1090-1092.

Cullis et al., "Growth ripples upon strained SiGe epitaxial layers on Si and misfit dislocation interactions," *Journal of Vacuum Science and Technology A*, vol. 12, No. 4 (Jul./Aug. 1994), pp. 1924-1931.

Currie et al., "Carrier mobilities and process stability of strained Si n- and p-MOSFETs on SiGe virtual substrates," *Journal of Vacuum Science and Technology B*, vol. 19, No. 6 (Nov./Dec. 2001), pp. 2268-2279.

Currie et al., "Controlling Thread Dislocation Densities in Ge on Si Using Graded SiGe Layers and Chemical-Mechanical Polishing," *Applied Physics Letters*, vol. 72, Issue 14 (Apr. 6, 1998), pp. 1718-1720.

Currie, "SiGe Virtual Substrate Engineering for Integration of III-V Materials, Microelectromechanical Systems and Strained Silicon Mosfets with Silicon," PhD Thesis, MIT, 2001, pp. 1-190.

Dilliway et al., "Characterization of Morphology and Defects in Silicon Germanium Virtual Substrates," *Journal of Materials Science*, vol. 11, Issue 7 (2000), pp. 549-556.

Eaglesham et al., "Dislocation-Free Stranski-Krastanow Growth of Ge on Si(100)," *Physical Review Letters*, vol. 64, No. 16 (Apr. 16, 1990), pp. 1943-1946.

Erdtmann et al., "GaInAs/InP Quantum Well Infrared Photodetectors on Si Substrate for Low-Cost Focal Plan Arrays," PhD Thesis, Northwestern University, 2000, pp. 1-225.

Feichtinger et al., "Misfit Dislocation Nucleation Study in p/p+ Silicon," *Journal of the Electrochemical Society*, 148 (7) (2001), pp. G379-G382.

Feijoo et al., "Epitaxial Si-Ge Etch Stop Layers with Ethylene Diamine Pyrocatechol for Bonded and Etchback Silicon-on-Insulator," *Journal of Electronic Materials*, vol. 23, No. 6 (Jun. 1994), pp. 493-496.

Fischetti et al., "Band structure, deformation potentials, and carrier mobility in strained Si, Ge, and SiGe alloys," *Journal of Applied Physics*, vol. 80, No. 4 (Aug. 15, 1996), pp. 2234-2252.

Fischetti, "Long-range Coulomb interactions in small Si devices. Part II. Effective electronmobility in thin-oxide structures," *Journal of Applied Physics*, vol. 89, No. 2 (Jan. 15, 2001), pp. 1232-1250.

Fitzgerald, "Dislocations in strained-layer epitaxy: theory, experiment, and applications," *Materials Science Reports*, vol. 7 (1991), pp. 87-142.

Fitzgerald et al., "Dislocation dynamics in relaxed graded composition semiconductors," *Materials Science and Engineering*, B67 (1999), pp. 53-61.

Fitzgerald et al., "GeSi/Si Nanostructures," *Department of Materials Science, M.I.T.*, (1995), pp. 1-15.

Fitzgerald et al., "Relaxed $Ge_xSi_{1-x}$ structures for III-V integration with Si and high mobility two-dimensional electron gases in Si," *American Vacuum Society*, (1992) pp. 1807-1819.

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991), pp. 811-813.

Garone et al., "Silicon vapor phase epitaxial growth catalysis by the presence of germane," *Applied Physics Letters*, vol. 56, No. 13 (Mar. 26, 1990), pp. 1275-1277.

Giovane et al., "Strain-Balanced Silicon-Germanium Materials Near IR Photodetection in Silicon-Based Optical Interconnects," PhD Thesis, MIT, 1998, pp. 1-134.

Godbey et al., "Fabrication of Bond and Etch-Back Silicon Insulator Using a Strained SI0.7GE0.3 Layer as an Etch Stop," *Journal of the Electrical Society*, vol. 137, No. 10 (Oct. 1990) pp. 3219-3223.

Gray et al., "Analysis and Design of Analog Integrated Circuits," John Wiley & Sons, 1984, pp. 605-632.

Grillot et al., "Acceptor diffusion and segregation in $(Al_xGa_{1-x})_{0.5}In_{0.5}P$ heterostructures," *Journal of Applied Physics*, vol. 91, No. 8 (Apr. 15, 2002), pp. 4891-4899.

Groenert et al., "Strategies for Direct Monolithic Integration of $Al_xGa_{(1-x)}As/In_xGa_{(1-x)}As$ LEDS and Lasers on Ge/GeSi/Si Substrates Via Relaxed Graded $Ge_xSi_{(1-x)}$ Buffer Layers," *Materials Research Society Symposium Proceedings*, vol. 692 (2002), pp. H.9.30.1-H.9.30.6.

Grützmacher et al., "Ge segregation in SiGe/Si heterostructures and its dependence on deposition technique and growth atmosphere," *Applied Physics Letters*, vol. 3, No. 18 (Nov. 1, 1993), pp. 2531-2533.

Hackbarth et al., "Alternatives to thick MBE-grown relaxed SiGe buffers," *Thin Solid Films*, vol. 369, No. 1-2 (Jul. 2000), pp. 148-151.

Hackbarth et al., "Strain relieved SiGe buffers for Si-based heterostructure field-effect transistors," *Journal of Crystal Growth*, vol. 201/202 (1999), pp. 734-738.

Halsall et al., "Electron diffraction and Raman studies of the effect of substrate misorientation on ordering in the AiGaInP sysstem," *Journal of Applied Physics*, vol. 85, No. 1 (Jan. 1999), pp. 199-202.

Herzog et al., "SiGe-based FETs: buffer issues and device results," *Thin Solid Films*, vol. 380 (2000), pp. 36-41.

Höck et al., "Carrier mobilities in modulation doped $Si1-xGex$ heterostructures with respect to FET applications," *Thin Solid Films*, vol. 336 (1998), pp. 141-144.

Höck et al., "High hole mobility in $Si_{0.17}Ge_{0.83}$ channel metal-oxide-semiconductor field-effect transistors grown by plasma-enhanced chemical vapor deposition," *Applied Physics Letters*, vol. 76, No. 26 (Jun. 26, 2000), pp. 3920-3922.

Höck et al., "High performance 0.25 μm p-type Ge/SiGe MODFETs," *Electronics Letters*, vol. 34, No. 19 (Sep. 17, 1998), pp. 1888-1889.

Houghton, "Strain Relaxation Kinetics in $Si_{1-x}Ge_x/Si$ Heterostructures," *Journal of Applied Physics*, vol. 70, No. 4 (Aug. 15, 1991), pp. 2136-2151.

Hsu et al., "Near Field Scanning Optical Microscopy Studies of Electronic and Photonics Materials and Devices," *Materials Science and Engineering Reports: A Review Journal*, vol. 33 (2001), pp. 1-50.

Hsu et al., "Surface morphology of related $Ge_xSi_{1-x}$ films," *Applied Physics Letters*, 61 (11) (Sep. 14, 1992), pp. 1293-1295.

Huang et al., (2001) "Carrier Mobility enhancement in strained Si-on-insulatoir fabricated by wafer bonding", *2001 Symposium on VLSI Technology, Digest of Technical Papers*, pp. 57-58.

Huang et al., "High-quality strain-relaxed SiGe alloy grown on implanted silicon-on-insulator substrate," *Applied Physics Letters*, vol. 76, No. 19 (May 8, 2000), pp. 2680-2682.

Huang et al., "The Impact of Scaling Down to Deep Submicron on CMOS RF Circuits," *IEEE Journal of Solid-State Circuits*, vol. 33, No. 7 (Jul. 1998), pp. 1023-1036.

Ishikawa et al., "Creation of Si-Ge-based SIMOX structures by low energy oxygen implantation," Proceedings of the 1997 IEEE International SOI Conference (Oct. 1997), pp. 16-17.

Ishikawa et al., "SiGe-on-insulator substrate using SiGe alloy grown Si(001)," *Applied Physics Letters*, vol. 75, No. 7 (Aug. 16, 1999), pp. 983-985.

Ismail et al., "Modulation-doped n-type Si/SiGe with inverted interface," *Applied Physics Letters*, vol. 65, No. 10 (Sep. 5, 1994), pp. 1248-1250.

Ismail, "Si/SiGe High-Speed Field-Effect Transistors," Electron Devices Meeting, Washington, D.C. (Dec. 10, 1995), pp. 20.1.1-20.1.4.

Kearney et al., "The effect of alloy scattering on the mobility of holes in a $Si_{1-x}Ge_x$ quantum well," *Semiconductor Science and Technology*, vol. 13 (1998), pp. 174-180.

Kim et al., "A Fully Integrated 1.9-GHz CMOS Low-Noise Amplifier," *IEEE Microwave and Guided Wave Letters*, vol. 8, No. 8 (Aug. 1998), pp. 293-295.

Kissinger, et al., "Stepwise Equilibrated Graded $Ge_xSe_{1-x}$ Buffer With Very Low Threading Dislocation Density on Si(001)," *Applied Physics Letters* vol. 66, No. 16 (Apr. 17, 1995), pp. 2083-2085.

Knall et al., "The Use of Graded in GaAs Layers and Patterned Substrates to Remove Threading Dislocations From GaAs on Si," *Journal of Applied Physics*, vol. 76, Issue 5 (Sep. 1, 1994), pp. 2697-2702.

Koester et al., "Extremely High Transconductance $Ge/Si_{0.4}Ge_{0.6}$ p-MODFET's Grown by UHV-CVD," *IEEE Electron Device Letters*, vol. 21, No. 3 (Mar. 2000), pp. 110-112.

König et al., "Design Rules for n-Type SiGe Hetero FETs," *Solid State Electronics*, vol. 41, No. 10 (1997), pp. 1541-1547.

König et al., "p-Type Ge-Channel MODFET's with High Transconductance Grown on Si Substrates," *IEEE Electron Device Letters*, vol. 14, No. 4 (Apr. 1993), pp. 205-207.

König et al., "SiGe HBTs and HFETs," *Solid-State Electronics*, vol. 38, No. 9 (1995), pp. 1595-1602.

Kummer et al., "Low energy plasma enhanced chemical vapor deposition," *Materials Science and Engineering*, B89 (2002), pp. 288-295.

Kuznetsov et al., "Technology for high-performance n-channel SiGe modulation-doped field-effect transistors," *Journal of Vacuum Science and Technology*, B 13(6) (Nov./Dec. 1995), pp. 2892-2896.

Langdo, "High Quality Ge on Si by Epitaxial Necking," *Applied Physics Letters*, vol. 76, Issue 25 (Jun. 19, 2000), pp. 3700-3702.

Langdo et al., (2002) "Preparation of Novel SiGe-free Strained Si on Insulator Substrates" *IEEE International SOI Conference*, pp. 211-212 (XP002263057).

Larson, "Integrated Circuit Technology Options for RFIC's Present Status and Future Directions," *IEEE Journal of Solid-State Circuits*, vol. 33, No. 3 (Mar. 1998), pp. 387-399.

Lee et al., "CMOS RF Integrated Circuits at 5GHz and Beyond," *Proceedings of the IEEE*, vol. 88, No. 10 (Oct. 2000), pp. 1560-1571.

Lee et al., "Strained Ge channel p-type metal-oxide-semiconductor field-effect transistors grown on Si1-xGex/Si virtual substrates," *Applied Physics Letters*, vol. 79, No. 20 (Nov. 12, 2001), pp. 3344-3346.

Lee et al., "Strained Ge channel p-type MOSFETs fabricated on Si1-xGex/Si virtual substrates," *Materials Research Society Symposium Proceedings*, vol. 686 (2002), pp. A1.9.1-A1.9.5.

LeGoues et al., "Relaxation of SiGe Thin Films Grown on Si/SiO2 Substrates," *Journal of Applied Physics*, vol. 75, Issue 11 (Jun. 1, 1974), pp. 2730-2738.

Leitz et al., "Channel Engineering of SiGe-Based Heterostructures for High Mobility MOSFETs," *Materials Research Society Symposium Proceedings*, vol. 686 (2002), pp. A3.10.1-A3.10.6.

Leitz et al., "Dislocation glide and blocking kinetics in compositionally graded SiGe/Si," *Journal of Applied Physics*, vol. 90, No. 6 (Sep. 15, 2001), pp. 2730-2736.

Leitz et al., "Hole mobility enhancements in strained $Si/Si_{1-y}Ge_y$ p-type metal-oxide-semiconductor field-effect transistors grown on relaxed S1-xGex (x<y) virtual substrates," *Applied Physics Letters*, vol. 79, No. 25 (Dec. 17, 2001), pp. 4246-4248.

Li et al., "Design of high speed Si/SiGe heterojunction complementary metal-oxide-semiconductor field effect transistors with reduced short-channel effects," *Journal of Vacuum Science and Technology A*, vol. 20, No. 3 (May/Jun. 2002), pp. 1030-1033.

Liu et al., "Growth Study of Surfactant-Mediated Relaxed SiGe Graded Layers for 1.55-μM Photodetector Applications," *Thin Solid Films*, vol. 380, Issue 1-2 (2000), pp. 54-56.

Liu et al., "High-Quality Ge Films on Si Substrates Using SB Surfactant-Mediated Graded SiGe Buffers," *Applied Physics Letters*, vol. 79, Issue 21 (Nov. 19, 2001), pp. 3431-3433.

Lu et al., "High Performance 0.1 μm Gate-Length P-Type SiGe MODFET's and MOS-MODFET's," *IEEE Transactions on Electron Devices*, vol. 47, No. 8 (Aug. 2000), pp. 1645-1652.

Luan et al. "High Quality Ge epilayers of Si with low threading-dislocation densities," *Applied Physics Letters*, vol. 75, No. 19 (Nov. 8, 1999), pp. 2909-2911.

Luo et al., "High-Quality Strain-Relaxed SiGe Films Grown with Low Temperature Si Buffer," *Journal of Applied Physics*, vol. 89, Issue 13 (Sep. 23, 1991), pp. 1611-1613.

Maiti et al., "Strained-Si heterostructure field effect transistors," *Semiconductor Science and Technology*, vol. 13 (1998), pp. 1225-1246.

Maszara, "Silicon-On-Insulator by Wafer Bonding: A Review," *Journal of the Electrochemical Society*, No. 1 (Jan. 1991), pp. 341-347.

Meyerson et al., "Cooperative Growth Phenomena in Silicon/Germanium Low-Temperature Epitaxy," *Applied Physics Letters*, vol. 53, No. 25 (Dec. 19, 1988), pp. 2555-2557.

Mizuno et al., "Advanced SOI-MOSFETs with Strained-Si Channel for High Speed CMOS-Electron/Hole Mobility Enhancement," 2002 Symposium on VLSI Technology, Honolulu (June 13-15), IEEE New York pp. 210-211.

Mizuno et al., "Electron and Hole Mobility Enhancement in Strained-Si MOSFET's on SiGe-on-Insulator Substrates Fabricated by SIMOX Technology," *IEEE Electron Device Letters*, vol. 21, No. 5 (May 2000), pp. 230-232.

Mizuno et al., "High Performance Strained-Si p-MOSFETs on SiGe-on-Insulator Substrates Fabricated by SIMOX Technology," *IEEE IEDM Technical Digest* (1999 International Electron Device Meeting), pp. 934-936.

Momose et al., "Dislocation-Free and Lattice-Matched $SiGAP_{1-x}N_x$/Si Structure for Photo-Electronic Integrated Systems," *Applied Physics Letters*, vol. 79, Issue 25 (Dec. 17, 2001), pp. 4151-4153.

Monroe et al., "Comparison of Mobility-Limited Mechanisms in High-Mobility $Si_{1-x}Ge_x$ Heterostructures," *Journal of Vacuum Science and Technology B*, vol. B11, Issue 4 (Jul./Aug. 1993), pp. 1731-1737.

Nayak et al., "High-Mobility Strained-Si PMOSFET's," *IEEE Transactions on Electron Devices*, vol. 43, No. 10 (Oct. 1996), pp. 1709-1716.

Oh et al., "Interdigitated Ge p-i-n Photodetectors Fabricated on a Si Substrate Using Graded SiGe Buffer Layers," *IEEE—Journal of Quantum Electronics*, vol. 38, Issue 9 (Sep. 2002), pp. 1238-1241.

Ohori et al., "Effect of Threading Dislocations on Mobility in Selectively Doped Heterostructures Grown on Si Substrates," *Journal of Applied Physics*, vol. 75, Issue 7 (Apr. 1, 1994), pp. 3681-3683.

O'Neill et al., "Si Ge virtual substrate N-channel heterojunction MOSFETS," *Semiconductor Science and Technology*, vol. 14 (1999), pp. 784-789.

Ota, "Application of heterojunction FET to power amplifier for cellular telephone," *Electronic Letters*, vol. 30, No. 11(May 26, 1994), pp. 906-907.

Papananos, "Radio-Frequency Microelectronic Circuits for Telecommunication Applications," Kluwer Academic Publishers, 1999, pp. 115-117, 188-193.

Parker et al., "SiGe heterostructure CMOS circuits and applications," *Solid State Electronics*, vol. 43 (1999), pp. 1497-1506.

Powell et al., "New Approach to the Growth of Low Dislocation Relaxed SiGe Material," *Applied Physics Letters*, vol. 64, Issue 14 (Apr. 4, 1994), pp. 1856-1858.

Ransom et al., "Gate-Self-Aligned n-channel and p-channel Germanium MOSFET's," *IEEE Transactions on Electron Devices*, vol. 38, No. 12 (Dec. 1991), pp. 2695.

Reinking et al., "Fabrication of high-mobility Ge p-channel MOSFETs on Si substrates," *Electronics Letters*, vol. 35, No. 6 (Mar. 18, 1999), pp. 503-504.

Rim, "Application of Silicon-Based Heterostructures to Enhanced Mobility Metal-Oxide-Semiconductor Field-Effect Transistors," PhD Thesis, Stanford University, 1999, pp. 1-184.

Rim et al., "Enhanced Hole Mobilities in Surface-Channel Strained-Si p-MOSFETs," *IEDM* (1995), pp. 517-520.

Rim et al., "Fabrication and Analysis of Deep Submicron Strained-Si N-MOSFET's," *IEEE Transactions on Electron Devices*, vol. 47, No. 7 (Jul. 2000), pp. 1406-1415.

Robbins et al., "A model for heterogeneous growth of $Si_{1-x}Ge_x$ films for hydrides," *Journal of Applied Physics*, vol. 69, No. 6 (Mar. 15, 1991), pp. 3729-3732.

Sadek et al., "Design of Si/SiGe Heterojunction Complementary Metal-Oxide-Semiconductor Transistors," *IEEE Transactions on Electron Devices* (Aug. 1996), pp. 1224-1232.

Sakaguchi et al., "ELTRAN® by Splitting Porous Si Layers," *Proceedings of the 195th International SOI Symposium*, vol. 99-3 (1999), pp. 117-121.

Sakai et al., "Reduction of Threading Dislocation Density in SiGe Layers on Si (001) Using a Two-Step Strain—Relaxation Procedure," *Applied Physics Letters*, vol. 79, Issue 21 (Nov. 19, 2001), pp. 3398-3400.

Samavedam et al., "Novel Dislocation Structure and Surface Morphology Effects in Relaxed Ge/Si-Ge (graded) / Si Structures," *Journal of Applied Physics*, vol. 87, Issue 7 (Apr. 1, 1997), pp. 3108-3116.

Schäffler, "High-Mobility Si and Ge Structures," *Semiconductor Science and Technology*, vol. 12 (1997), pp. 1515-1549.

Schimmel, "Defect Etch for <100> Silicon Evaluation," *Journal of the Electrochemical Society*, vol. 126, No. 3 (Mar. 1979), pp. 479-482.

Sugimoto et al., "A 2V, 500 MHz and 3V, 920 MHz Low-Power Current-Mode 0.6 μm CMOS VCO Circuit," *IEICE Trans Electron*, vol. E82-C, No. 7 (Jul. 1999), pp. 1327-1329.

Taylor et al., "Optoelectronic Device Performance on Reduced Threading Dislocation Density GaAs/Si," *American Institute of Physics*, vol. 89, Issue 8 (Apr. 15, 2001), pp. 4365-4375.

Ternent et al., "Metal Gate Strained Silicon MOSFETs for Microwave Integrated Circuits," *IEEE* (Oct. 2000), pp. 38-43.

Ting et al., "Monolithic Integration of III-V Materials and Devices on Silicon," *SPIE Conference 1999—Silicon Based Optoelectronics*, vol. 3630 (Jan. 1999), pp. 19-28.

Tsang et al., "Measurements of alloy composition and strain in thin $Ge_xSi_{1-x}$ layers," *Journal of Applied Physics*, vol. 75, No. 12 (Jun. 15, 1994), pp. 8098-8108.

Tweet et al., "Factors determining the composition of strained GeSi layers grown with disilane and germane," *Applied Physics Letters*, vol. 65, No. 20 (Nov. 14, 1994), pp. 2579-2581.

Usami et al., "Spectroscopic study of Si-based quantum wells with neighboring confinement structure," *Semiconductor Science and Technology*, (1997), abstract.

Valtuena et al., "Influence of the Surface Morphology on the Relaxation of Low-Strained $In_xGa_{1-x}$ As Linear Buffer Structures," *Journal of Crystal Growth*, vol. 182 (1997), pp. 281-291.

Watson et al., "Relaxed, Low Threading Defect Density $Si_{0.7}Ge_{0.3}$ Epitaxial Layers Grown on Si by Rapid Thermal Chemical Vapor Deposition" *Journal of Applied Physics*, vol. 75, Issue 1 (Jan. 1, 1994), pp. 263-269.

Welser et al., "Electron Mobility Enhancement in Strained-Si N-Type Metal-Oxide-Semiconductor Field-Effect Transistors," *IEEE Electron Device Letters*, vol. 15, No. 3 (Mar. 1994), pp. 100-102.

Welser et al., "Evidence of Real-Space Hot-Electron Transfer in High Mobility, Strained-Si Multilayer MOSFETs," *IEEE IEDM Technical Digest* (1993 International Electron Devices Meeting), pp. 545-548.

Welser et al., "NMOS and PMOS Transistors Fabricated in Strained Silicon/Relaxed Silicon-Germanium Structures," *IEEE IEDM Technical Digest* (1992 International Electron Devices Meeting), pp. 1000-1002.

Welser, "The Application of Strained Silicon/Relaxed Silicon Germanium Heterostructures to Metal-Oxide-Semiconductor Field-Effect Transistors," PhD Thesis, Stanford University, 1994, pp. 1-205.

Wolf et al., "Silicon Processing for the VLSI Era, vol. 1: Process Technology," Lattice Press, Sunset Beach, CA, 1986, pp. 384-386.

Xie et al., "Fabrication of High Mobility Two-Dimensional Electron and Hole Gases in GeSi/Si," *Journal of Applied Physics*, vol. 73, Issue 12 (Jun. 15, 1993), pp. 8364-8370.

Xie et al., "Semiconductors Surface Roughness: Dependence on Sign and Magnitude of Bulk Strain," *The Physical Review Letters*, vol. 73, No. 22 (nov. 28, 1994), pp. 3006-3009.

Xie et al., "Very High Mobility Two-Dimensional Hole Gas in $Si/Ge_xSi_{1-x}/Ge$ Structures Grown by Molecular Beam Epitaxy," *Applied Physics Letters*, vol. 63, Issue 16 (Oct. 18, 1993), pp. 2263-2264.

Xie, "SiGe Field Effect Transistors," *Materials Science and Engineering*, vol. 25 (1999), pp. 89-121.

Yamagata et al., "Bonding, Splitting and Thinning by Porous Si in ELTRAN®; SOI-Epi Wafer™," *Materials Research Society Symposium Proceedings*, vol. 681E (2001), pp. 18.2.1-18.2.10.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000), pp. 161-163.

Zhang et al., "Demonstration of a Ga-As-Based Compliant Substrate Using Wafer Bonding and Substrate Removal Techniques," Electronic Materials and Processing Research Laboratory, Department of Electrical Engineering, University Park, PA 16802, 1998, pp. 25-28.

"Optimal Growth Technique and Structure for Strain Relaxation of Si-Ge Layers on Si Substrates," *IBM Technical Disclosure Bulletin*, vol. 32, No. 8A (Jan. 1990), pp. 330-331.

"2 Bit/Cell EPPROM Cell Using Band to Band Tunneling for Data Read-Out," *IBM Technical Disclosure Bulletin*, vol. 35, No. 4B (Sep. 1992), pp. 136-140.

International Search Report for PCT/US2004/002282, Oct. 4, 2004, 6 pages.

* cited by examiner

SEMICONDUCTOR STRUCTURES WITH STRUCTURAL HOMOGENEITY

RELATED APPLICATIONS

This application claims the benefit of U.S. Provisional Application Ser. No. 60/442,784, filed on Jan. 27, 2003, the entire disclosure of which is hereby incorporated by reference.

FIELD OF THE INVENTION

This invention relates generally to semiconductor substrates and particularly to substrates with strained semiconductor layers.

BACKGROUND

"Virtual substrates" based on silicon (Si) and germanium (Ge) provide a platform for new generations of very large scale integration (VLSI) devices that exhibit enhanced performance in comparison to devices fabricated on bulk Si substrates. The important component of a SiGe virtual substrate is a layer of SiGe that has been relaxed to its equilibrium lattice constant (i.e., one that is larger than that of Si). This relaxed SiGe layer may be directly applied to a Si substrate (e.g., by wafer bonding or direct epitaxy), or atop a relaxed graded SiGe buffer layer in which the lattice constant of the SiGe material has been increased gradually over the thickness of the layer. The SiGe virtual substrate may also incorporate buried insulating layers, in the manner of a silicon-on-insulator (SOI) wafer. To fabricate high-performance devices on these platforms, thin strained layers of semiconductors, such as Si, Ge, or SiGe, are grown on the relaxed SiGe virtual substrates. The resulting biaxial tensile or compressive strain alters the carrier mobilities in the layers, enabling the fabrication of high-speed and/or low-power-consumption devices. The thin strained semiconductor layers may also be subsequently transferred to other substrates having insulator layers by methods such as wafer bonding, thus creating strained-semiconductor-on-insulator (SSOI) wafers.

In certain cases the microstructure of semiconductor graded buffer layers as grown may be less than ideal depending on the growth conditions. For example, SiGe buffer layers deposited at temperatures below 850° C. may not attain the relaxation state desired for strained Si applications, i.e., >98%. In addition, the density of threading dislocations may be higher than desired. Furthermore, both high and low temperature growth conditions may result in as-grown graded buffer layers having top surfaces that are rougher than the ultra-planar surfaces preferable for growth of relaxed semiconductor cap layers with subsequent strained semiconductor layer deposition (e.g., regrowth of SiGe layers containing 20% Ge, followed by deposition of strained Si). This roughness may carry over and increase in subsequently formed layers. In addition, roughness on a layer surface negatively impacts the ability of laser scanning tools to perform optical inspection for defects in the layer before and after planarization and regrowth. Roughness appears in the scattered signal of the laser scanner as an elevated level of "haze" or background noise, reducing the ability of the tool to detect small defects in and on the layer. It is desirable, therefore, to reduce this roughness in semiconductor layers.

SUMMARY

One technique suitable for fabricating strained Si wafers may include the following steps:
1. Providing a silicon substrate;
2. Epitaxially depositing a relaxed, graded SiGe buffer layer to some final Ge composition on the silicon substrate;
3. Epitaxially depositing a relaxed SiGe cap layer having a constant composition on the SiGe buffer layer;
4. Annealing the layers at a temperature greater than a growth temperature of the layers to relax strain or modify the morphology of the layers, at any point during or after Steps 2 and 3;
5. Planarizing a surface of the SiGe cap layer by, e.g., chemical mechanical polishing (CMP), and cleaning the resulting planarized surface;
6. Epitaxially depositing a relaxed SiGe regrowth layer having a constant composition on the planarized surface; and
7. Epitaxially depositing a strained Si layer on the SiGe regrowth layer.
8. Measuring the surface quality of the strained Si layer using laser scanning techniques.

Annealing at elevated temperatures may improve the properties of layers deposited at relatively low temperatures, e.g., below 850° C. Various layer properties, in addition to relaxation and threading dislocation densities, are important for making strained semiconductor layers, e.g., strained silicon layers. For example, at high temperature growth conditions (>850° C.), graded and constant composition SiGe buffer layers may contain microstructural phenomena such as decomposition. Decomposition may sometimes be observed as narrow vertical bands of varying composition, i.e., vertical superlattices.

Elevated temperature annealing before, after, or between planarization process steps may be used to improve the microstructure of semiconductor layers. Compositional variation within layers is reduced, thereby enabling the formation of layers with top surfaces that remain smooth even after cleaning steps that etch different compositions at different rates.

In some embodiments, compositional superlattices may be avoided by appropriate selection of semiconductor layer growth parameters and regrowth layer parameters.

In an aspect, the invention features a method for forming a semiconductor structure, the method including providing a substrate, and forming a semiconductor layer over a top surface of the substrate, the semiconductor layer including at least two elements, the elements being distributed to define an initial compositional variation within the semiconductor layer. The semiconductor layer is annealed to reduce the initial compositional variation.

One or more of the following features may be included. The substrate may have a first lattice constant, the semiconductor layer may have a second lattice constant, and the first lattice constant may differ from the second lattice constant. The first element may have a first concentration, a second element may have a second concentration, and each of the first and second concentrations may be at least 5%. The initial compositional variation may vary periodically within the semiconductor layer in a direction perpendicular to a semiconductor layer deposition direction. The compositional variation may define a column within the semiconductor layer, the column having a width and a period. The columnar period may be less than approximately 2000 nanometers (nm), e.g., less than approximately 1000 nm.

The semiconductor layer may be annealed at an annealing temperature and/or for a duration sufficient to diffuse at least one of the two elements through a diffusion length at least equal to a quarter of the columnar period.

The initial compositional variation may vary in a direction parallel to a semiconductor layer deposition direction and define a superlattice having a periodicity. The superlattice periodicity may be less than approximately 100 nm, preferably less than approximately 50 nm, and more preferably less than approximately 10 nm. The semiconductor layer may be annealed at an annealing temperature sufficient to diffuse at least one of the two elements through a diffusion length at least equal to a quarter-period of the superlattice and/or for a duration sufficient to diffuse at least one of the two elements through a diffusion length at least equal to a quarter-period of the superlattice.

The semiconductor layer may be annealed at an annealing temperature greater than the deposition temperature. The annealing temperature may be greater than about 800° C., e.g., greater than about 1000° C.

The semiconductor layer may be annealed at an annealing temperature below a melting point of the semiconductor layer, e.g., less than about 1270° C.

At least one of the at least two elements may be silicon and/or germanium. A top surface of the semiconductor layer may be planarized. The top surface of the semiconductor layer may be planarized before, while, or after the semiconductor layer is annealed. Planarizing may include chemical-mechanical polishing, plasma planarization, wet chemical etching, gas-phase chemical etching [preferably at elevated temperature, e.g., above 900° C., in an ambient including an etch species, e.g., hydrogen chloride (HCl)], oxidation followed by stripping, and/or cluster ion beam planarization.

Chemical-mechanical polishing may include a first and a second step and the semiconductor layer may be annealed between the first and the second chemical-mechanical polishing steps and/or before the first chemical-mechanical polishing step. The planarization may include a high temperature step and the semiconductor layer may be annealed during the high temperature planarization step.

A top surface of the semiconductor layer may be bonded to a wafer, and at least a portion of the substrate may be removed, such that at least a portion of the semiconductor layer remains bonded to the wafer after the portion of the substrate is removed.

A second layer may be formed over the semiconductor layer subsequent to planarizing the top surface of the semiconductor layer. The second layer may include a material having a lattice constant substantially equal to or substantially different from a lattice constant of the semiconductor layer. A top surface of the second layer may be bonded to a wafer and at least a portion of the substrate may be removed, such that at least a portion of the second layer remains bonded to the wafer after the portion of the substrate is removed.

A second layer may be formed over the semiconductor layer subsequent to planarizing the top surface of the semiconductor layer. The second layer may include a material having a lattice constant substantially equal to or substantially different from a lattice constant of the semiconductor layer. A top surface of the second layer may be bonded to a wafer, and at least a portion of the substrate may be removed, with at least a portion of the second layer remaining bonded to the wafer after the portion of the substrate is removed. The second layer may include (i) a lower portion having a superlattice and (ii) an upper portion disposed over the lower portion, the upper portion being substantially free of a superlattice.

The semiconductor layer may have an undulating surface. The undulating surface may be formed during deposition of the semiconductor layer. The substrate may have an undulating substrate surface, and the undulating substrate surface induces the formation of the undulating surface of the semiconductor layer. The undulating surface may have an amplitude, the initial compositional variation may define a superlattice having a periodicity, and the periodicity of the superlattice may be less than the amplitude of the undulating surface.

A relaxed graded layer may be formed over the substrate, such that the semiconductor layer is formed over the relaxed graded layer. The relaxed graded layer may serve to provide the semiconductor layer with a lattice spacing different from that of the substrate while reducing defect nucleation. A protective layer may be formed over the semiconductor layer prior to annealing the semiconductor layer. The protective layer may include a material that is substantially inert with respect to the semiconductor layer, such as, for example, silicon dioxide or silicon nitride. The anneal may be performed as a batch process on multiple wafers at once, for example, in a tube furnace, to improve throughput and economics.

In another aspect, the invention features a method for forming a semiconductor structure, including providing a substrate, and selecting a first plurality of parameters suitable for forming a semiconductor layer over a top surface of the substrate, the semiconductor layer including at least two elements, the elements being distributed to define a compositional variation within the semiconductor layer. The semiconductor layer having a haze is formed, and the semiconductor layer is planarized to remove the haze.

One or more of the following features may be included. Forming the semiconductor layer may include forming a lower portion having a superlattice, and forming an upper portion over the lower portion, the upper portion being substantially free of a superlattice. The first plurality of parameters may include temperature, precursor, growth rate, and/or pressure. The semiconductor layer may be cleaned after planarizing, with the semiconductor layer remaining substantially haze-free after cleaning. A second plurality of parameters may be selected that is suitable for forming a substantially haze-free regrowth layer over the semiconductor layer, the semiconductor layer including at least two elements, the elements being distributed to define a compositional variation within the semiconductor layer. The substantially haze-free regrowth layer may be formed. The first plurality of parameters may include a first temperature, the second plurality of parameters may include a second temperature, and the first temperature may be higher than the second temperature. The first plurality of parameters include a first growth rate, the second plurality of parameters may include a second growth rate, and the first growth rate may be higher than the second growth rate. Forming the regrowth layer may include forming a lower portion having a superlattice and forming an upper portion over the lower portion, the upper portion being substantially free of a superlattice.

In another aspect, the invention features a semiconductor structure including a substrate, and a semiconductor layer disposed over the substrate, the semiconductor layer including at least two elements and having a top surface. The semiconductor layer top surface is substantially haze-free.

One or more of the following features may be included. A portion of the semiconductor layer disposed below the top surface may include a superlattice. A relaxed graded layer may be disposed between the substrate and the semiconductor layer. The semiconductor layer top surface may have a roughness root-mean-square of less than 10 angstroms (Å), preferably less than 5 Å in a scan area of 40 μm×40 μm, and a contamination level of less than 0.29 particles/cm², the particles having a diameter greater than 0.12 micrometers (μm). Preferably, the roughness is less than 1 Å root-mean-square in a scan area of 1 μm×1 μm.

The semiconductor layer top surface may have a roughness of less than 10 Å, preferably less than 5 Å root-mean-square in a scan area of 40 μm×40 μm and a contamination level of less than 0.16 particles/cm², the particles having a diameter greater than 0.16 μm. Preferably, the roughness is less than 1 Å root-mean-square in a scan area of 1 μm×1 μm.

The semiconductor layer top surface may have a roughness of less than 10 Å, preferably less than 5 Å root-mean-square in a scan area of 40 m×40 μm and a contamination level of less than 0.08 particles/cm², the particles having a diameter greater than 0.2 μm. Preferably, the roughness is less than 1 Å root-mean-square in a scan area of 1 μm×1 μm.

The semiconductor top surface may have a roughness of less than 10 Å, preferably less than 5 Å root-mean-square in a scan area of 40 μm×40 μm and a contamination level of less than 0.019 particles/cm², the particles having a diameter greater than 1 μm. Preferably, the roughness is less than 1 Å root-mean-square in a scan area of 1 μm×1 μm.

The semiconductor layer top surface may have a roughness of less than 0.5 Å root-mean-square in a scan area of 1 μm×1 μm and a contamination level of less than 0.09 particles/cm², the particles having a diameter greater than 0.09 μm.

In another aspect, the invention features a semiconductor structure including a substrate, and a semiconductor layer disposed over the substrate, the semiconductor layer including at least two elements. A regrowth layer is disposed over the semiconductor layer, the regrowth layer having a top surface that is substantially haze-free.

One or more of the following features may be included. The regrowth layer may include a semiconductor material, such as silicon. The regrowth layer may be strained. A portion of the regrowth layer disposed below the regrowth layer top surface may include a superlattice.

In another aspect, the invention features a semiconductor structure including a wafer, and a semiconductor layer bonded to the wafer, the semiconductor layer having a top surface that is substantially haze-free.

One or more of the following features may be included. The semiconductor layer may include silicon and/or germanium. The semiconductor layer may be strained. The wafer may include an insulating layer. The insulating layer may include silicon dioxide.

DETAILED DESCRIPTION

Roughness on semiconductor graded buffer layers may be separated into two components, each with distinct characteristics. A first component is a cross-hatch that arises from strain fields created by the formation of misfit dislocations. Cross-hatch has the form of a network of perpendicular waves with several characteristic wavelengths. For many graded buffer layers formed on wafers, for example layers constituted of group IV or III-V semiconductors with diamond cubic or zinc blende crystal structures, this cross-hatch is generally oriented in the <110> in-plane direction of the wafers. This relatively widely spaced component of surface texture may be likened to a surface feature referred to in the SEMI Specifications as "waviness." A second component, present in different degrees depending on the growth conditions, is small-scale roughness with no obvious directionality, a smaller amplitude, and a shorter spatial wavelength than the cross-hatch. This fine-scale roughness may be a major contributor to haze measured on semiconductor layers by laser defect scanning tools. Methods for reducing or eliminating both cross-hatch and fine scale roughness are described below.

Figure 1:
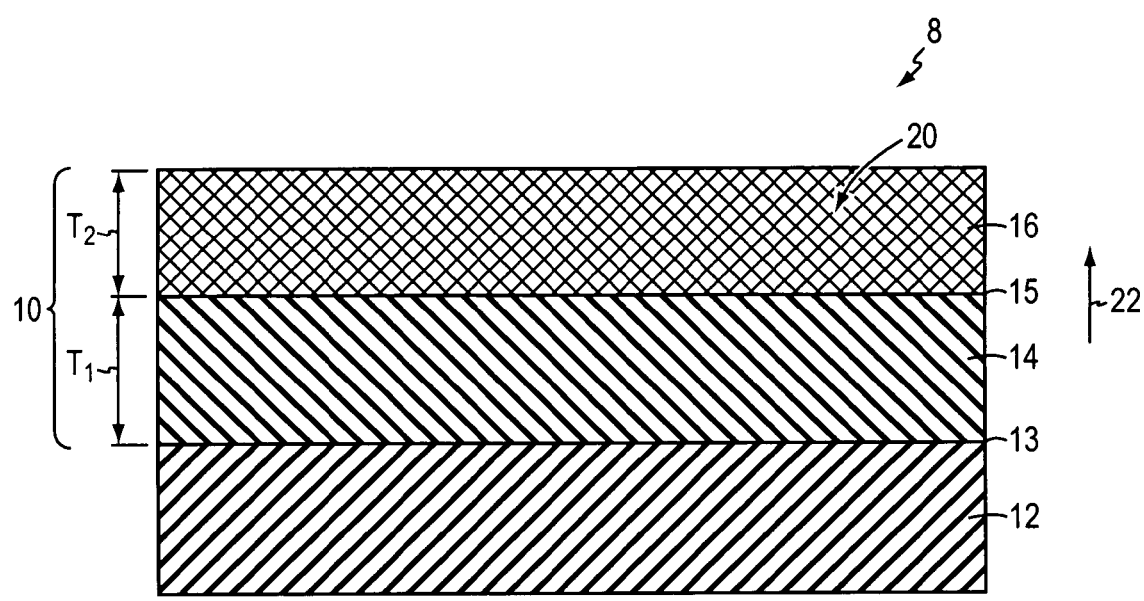
FIGS. 1-6 and 8-11 are schematic cross-sectional views of semiconductor substrates illustrating superlattices, columnar structures, and processes for forming homogeneous, smooth semiconductor layers.

Referring to FIG. 1, an epitaxial wafer 8 has a plurality of layers 10 disposed over a substrate 12. Substrate 12 may be formed of a semiconductor, such as Si, Ge, or SiGe. Substrate 12 may also include an insulator layer (not shown). The plurality of layers 10 formed on a top surface 13 of substrate 12 includes a graded buffer layer 14, which may be relaxed and may be formed of $Si_{1-y}Ge_y$, with a maximum Ge content of, e.g., 10-100% (i.e., y=0.1-1.0) and a thickness $T_1$ of, for example, greater than or equal to 0.5 μm, e.g., 0.5-10 μm. A semiconductor layer 16 is disposed over graded buffer layer 14. Semiconductor layer 16 may be relaxed, and may contain at least two elements. The substrate may have a first lattice constant and the semiconductor layer 16 may have a second lattice constant, such that the first lattice constant differs from the second lattice constant. The first element may have a first concentration and the second element may have a second concentration, and each of the first and second concentrations may be greater than 5%. The two elements may be, for example, silicon and germanium (e.g., $Si_{1-x}Ge_x$). $Si_{1-x}Ge_x$ may have a Ge content of for example, 10-100% (i.e., x=0.1-1.0), and a a thickness $T_2$ of, for example, 0.2-2 μm. In some embodiments, $Si_{1-x}Ge_x$ may include $Si_{0.80}Ge_{0.20}$ and $T_2$ may be approximately 1.5 μm. Semiconductor layer 16 may be >90% relaxed, as determined by triple axis x-ray diffraction, and may have a threading dislocation density of $<1×10^6$ cm$^{-2}$, as determined by etch pit density (EPD) and plan-view transmission electron microscopy (PVTEM) analysis.

Graded layer 14 and semiconductor layer 16 may be formed by epitaxy, such as by atmospheric-pressure chemical vapor deposition (APCVD), low-(or reduced-) pressure CVD (LPCVD), ultra-high-vacuum CVD (UHVCVD), or by molecular beam epitaxy (MBE). The epitaxial deposition system may be a single-wafer or multiple-wafer batch reactor. The growth system may include a horizontal flow reactor, in which process gases are introduced into the reactor from one side and exit the reactor from another side, after passing over one or more substrates. The growth system may also utilize a low-energy plasma to enhance layer growth kinetics. The deposition temperature may be 500-1200° C.

Substrate 12, graded layer 14, and semiconductor layer 16 may be formed from various materials systems, including various combinations of group II, group III, group IV, group V, and group VI elements. For example, each of substrate 12, graded layer 14, and semiconductor layer 16 may include a III-V compound. Substrate 12 may include gallium arsenide (GaAs), and graded layer 14 and semiconductor layer 16 may include indium gallium arsenide (InGaAs) or aluminum gallium arsenide (AlGaAs). These examples are merely illustrative, and many other material systems are suitable.

In alternative embodiments, semiconductor layer 16 is tensilely strained (e.g., $Si_xGe_{1-x}$ disposed over $Si_yGe_{1-y}$ where y<x). In other embodiments, semiconductor layer 16 is compressively strained (e.g., $Si_xGe_{1-x}$ disposed over $Si_yGe_{1-y}$ where y>x). In these cases, semiconductor layer 16 may be disposed over a relaxed semiconductor layer. In some embodiments, a strained layer (not shown) may be formed on a top surface of semiconductor layer 16 or graded layer 14.

Figure 2:
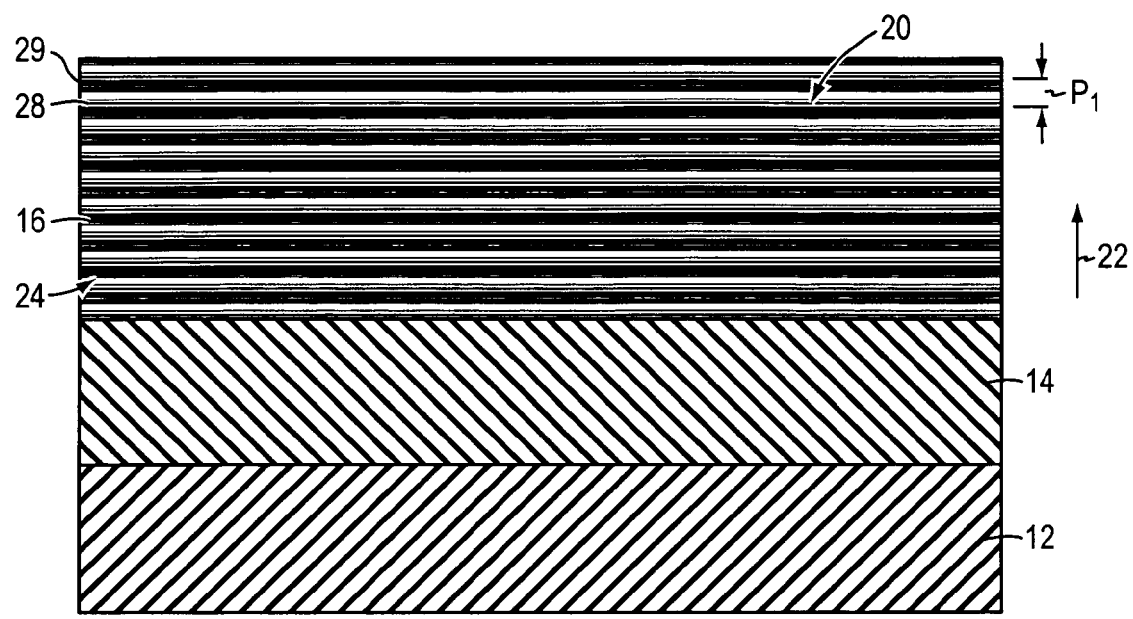

Referring to FIG. 2 as well as to FIG. 1, as deposited, a distribution of the elements from which semiconductor layer 16 is formed may have an initial compositional variation 20. For example, if semiconductor layer 16 includes 20% Ge ($Si_{0.80}Ge_{0.20}$), the actual Ge concentration within layer 16 may vary by a total of 4%, e.g., 18-22%. This initial compositional variation 20 may vary in semiconductor layer 16 in a direction parallel to a deposition direction 22 thereof.

Compositional variation 20 may define a superlattice 24 having a periodicity $P_1$. Superlattice 24 has alternating regions with low 28 and high 29 concentrations of an element, e.g., Ge, alternating in the same layer, such as in semiconductor layer 16. Such alternation may occur in a horizontal flow deposition reactor, in which a higher fraction of an element is incorporated at a leading edge of a substrate, i.e., an edge of wafer 8. The element fraction, e.g., Ge concentration, may alternate vertically within semiconductor layer 16 because substrate 10 may be rotated during deposition, thus changing the leading edge first exposed to gas flow. Depending on deposition parameters, alternating compositions within a layer may also occur in layers formed in other types of deposition systems. Superlattice 24 may have a superlattice periodicity $P_1$. Periodicity $P_1$ may be less than approximately 100 nm, including less than 50 nm or less than 10 nm. In an embodiment, periodicity $P_1$ may be 8 nm with, e.g., region 29 having a thickness of 4 nm with Ge concentration above, e.g., 20% and region 28 having a thickness of 4 nm with Ge concentration below, e.g., 20%.

Figure 3:
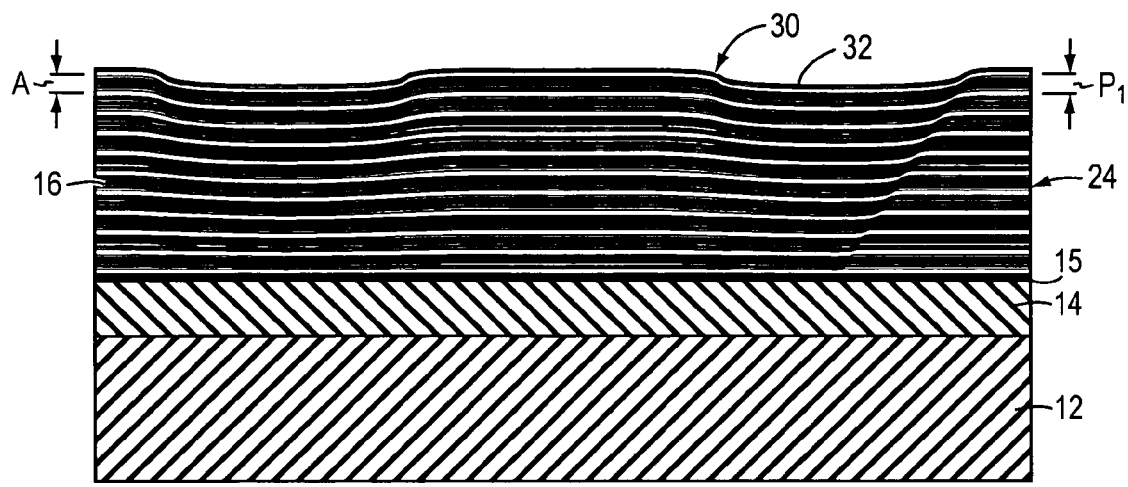

Referring to FIG. 3, semiconductor layer 16 may be formed over graded buffer layer 14 having a top surface 15 that may not be completely smooth, i.e., it may have cross-hatch formed by strain fields arising from the formation of misfit dislocations. A cross-hatch may have, for example, a relatively high Ge concentration at a peak and a relatively low Ge concentration in a trough. Cross-hatch may have a wavelength of 1-10 μm and an amplitude of 1-100 nm. Graded buffer layer surface 15 may also have fine-scale roughness, with a wavelength of, e.g., 10-100 nm and a height of 1-50 Å. Both cross-hatch and fine-scale roughness may carry over to cause undulation 30 in a top surface 32 of semiconductor layer 16. Undulation 30 may be formed during deposition of semiconductor layer 16. Undulation 30 has an amplitude A that may be greater than periodicity $P_1$ of superlattice 24.

Figure 4:
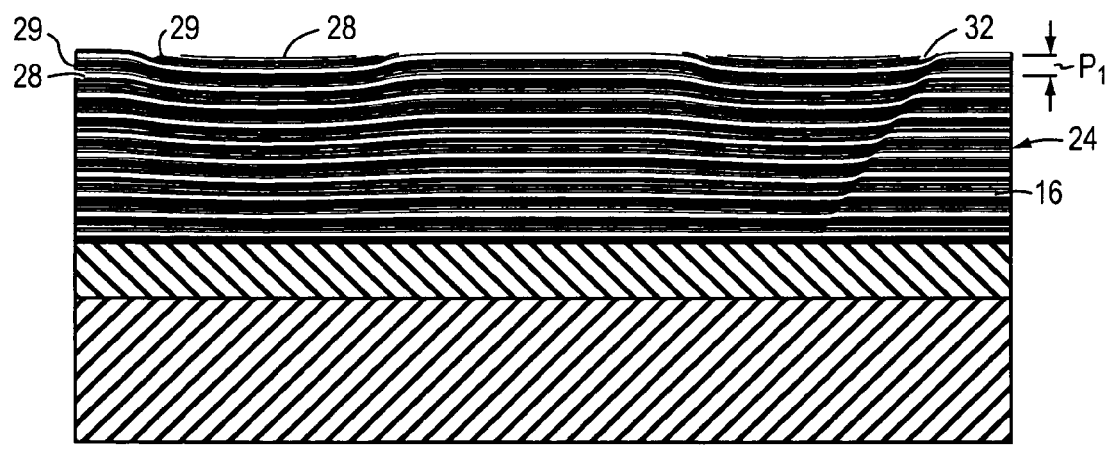

Referring to FIG. 4, semiconductor layer surface 32 may be planarized by, e.g., CMP. Planarization exposes lateral composition variations on planarized semiconductor layer surface 32. The periodicity $P_1$ of elements disposed in semiconductor layer 16, i.e., superlattice 24, however, may cause problems with subsequent processing. For example, maintaining the planarity of semiconductor layer 16 may be challenging. Cleaning steps after planarization may re-roughen surface 32. A wet cleaning solution whose removal rate is compositionally dependent may result in a rough top surface if there is lateral compositional variation in the layer being cleaned and the removal rate is compositionally dependent. Such a solution may, for example, selectively etch portions of layer 16 with higher concentrations of a particular element, such as region 29 having a higher concentration of, e.g., Ge, more quickly than portions of layer 16 with a lower concentration of the same element, such as region 28 having a lower concentration of, e.g., Ge. An example of such a wet etch is RCA SC1, i.e., ammonium hydroxide, hydrogen peroxide, and deionized water at a ratio of, e.g., 1:1:10 or 1:1:100, at 40-80° C. for about 10 minutes, with or without megasonic agitation.

Figure 5:
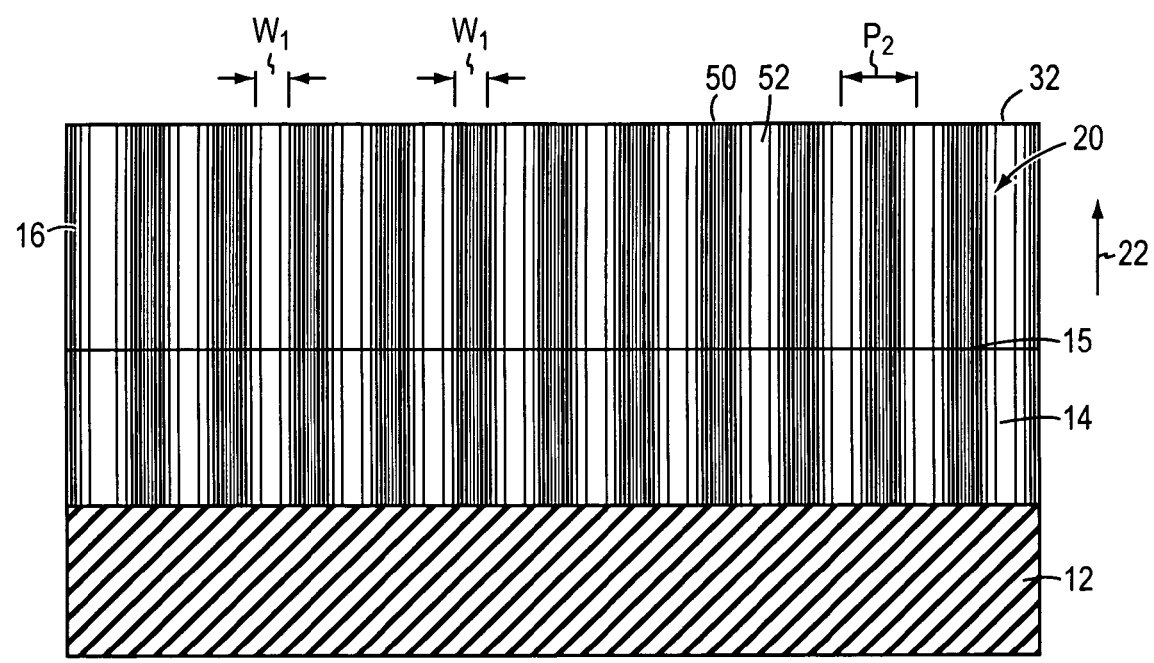

Referring to FIG. 5, in an alternative embodiment, initial compositional variation 20 may vary in semiconductor layer 16 in a direction perpendicular to the deposition direction 22 thereof. Initial compositional variation 20 may define a column 50 within semiconductor layer 16. Column 50 may have an irregular cross-section. Column 50 may form as a result of an interaction between the cross-hatch formed on surface 15 of graded layer 14 and superlattice 24 (see, e.g., FIGS. 2-4). This interaction may cause decomposition during the formation of semiconductor layer 16, resulting in the formation of a plurality of columns 50 having a relatively high concentration of an element, e.g., Ge, alternating with a plurality of columns 52 having a relatively low concentration of the same element. Column 50 and column 52 may each have a width $W_1$ less than approximately 1000 nm, such that columnar period $P_2$, including column 50 and column 52 (one dark region and one light region in FIG. 5) is less than approximately 2000 nm. In some embodiments, columnar period $P_2$ may be less than 1000 nm. Semiconductor layer surface 32 may be planarized, e.g., by CMP. The presence of columns 50, 52 with varying compositions in semiconductor layer 16, however, may cause problems with subsequent processing. For example, maintaining the planarity of semiconductor layer 16 may be challenging. Cleaning steps after planarization may re-roughen surface 32. Cleaning solutions, such as RCA SC1 may selectively etch faster portions of layer 16 with higher concentrations of a particular element, such as columns 50 having a higher concentration of, e.g., Ge than portions of layer 16 with lower concentrations of the same element, such as columns 52 having a lower concentration of, e.g., Ge.

Figure 6:
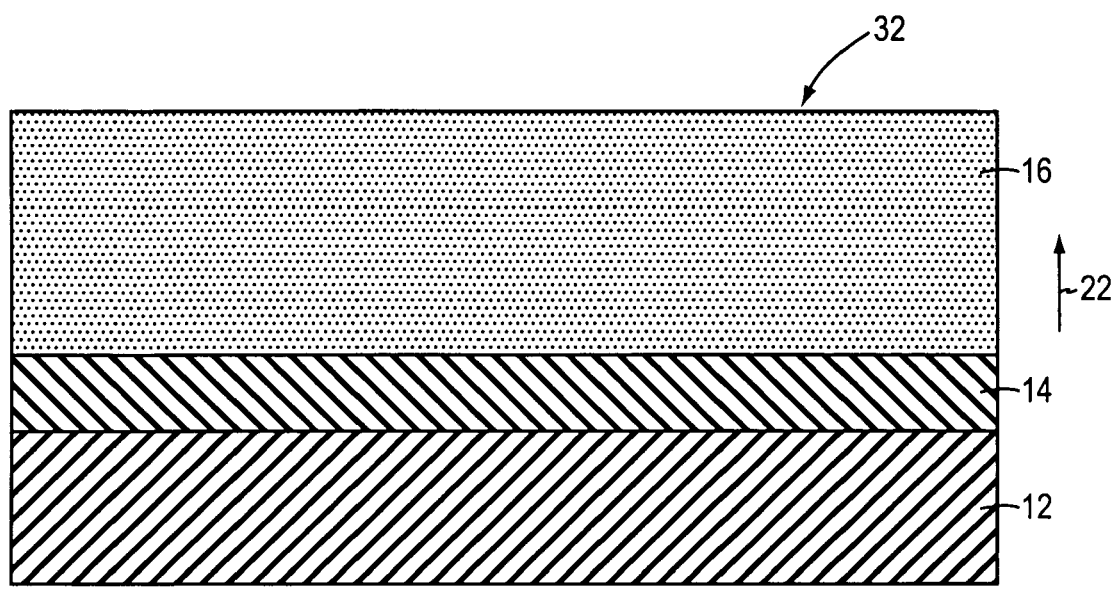

Referring to FIG. 6, the initial compositional variation within semiconductor layer 16 may be reduced by annealing semiconductor layer 16. The resulting reduction of the initial compositional variation may substantially eliminate superlattice 24, as well as columns 50, 52, resulting in a relatively homogeneous compositional distribution within semiconductor layer 16. The relatively uniform composition of semiconductor layer 16 reduces the aforementioned effects of cleaning steps, i.e., non-uniform etch rates of semiconductor layer 16 regions with varying compositions, resulting in roughening of semiconductor layer surface 32. Annealing may increase the amplitude and wavelength of the cross-hatch, but reduces the short wavelength roughness. The cross-hatch may have a wavelength sufficiently long so that a small increase in the long wavelength roughness (>1 μm) may not affect optical scanning measurements of semiconductor layer surface 32.

Referring to FIGS. 3 and 6, the annealing temperature may be sufficient to diffuse at least one of the at least two elements included in semiconductor layer 16 through a diffusion length at least equal to one-quarter the period $P_1$ of superlattice 24, in a cost-effective time. For example, to diffuse Ge through a diffusion length of 100 nm, the annealing temperature may be at least 850° C. at a duration of 300,000 seconds (83.3 hours). This temperature and duration may be derived from the following equations. The diffusion length x may be calculated by:

$$x = 2*(Dt)^{0.5} \quad \text{(Equation 1)}$$

where
x is the characteristic diffusion length,
D is the characteristic diffusion coefficient of one of the at least two elements in another of the at least two elements, and
t is the diffusion time.
The diffusion coefficient D is given by the following:

$$D = D_o \exp(-E/kT) \quad \text{(Equation 2)}$$

where
$D_o$ is the pre-exponential factor,
E is the activation energy,
k is the Boltzmann constant, and
T is the annealing temperature (in degrees Kelvin).

For example, for germanium diffusing in silicon, the following values may be obtained from published literature: $D_o = 6.26 \times 10^5$ cm$^2$/sec, E=5.28 eV, and k=8.63×10$^{-5}$ eV/K. Using these values, the characteristic diffusion distance may be calculated for a range of anneal times, and plotted versus temperature (see, e.g., FIG. 7). The various values of the diffusion constants for germanium in silicon that are available may produce somewhat different results (see below). In some embodiments, the duration of the anneal is selected to be sufficient to diffuse at least one of the at least two elements included in semiconductor layer 16 through a diffusion length at least equal to a quarter of the period $P_1$ of superlattice 24, at an acceptable temperature, i.e., a temperature high enough to provide adequate throughput without damaging the substrate or melting semiconductor layer 16. This temperature may be greater than about 800° C. and less than about 1270° C. For example, to diffuse Ge through a diffusion length of at least 100 nm, the duration of the annealing may be at least 12 seconds at a temperature of 1250° C. This duration may be derived from equations 1-2 and/or FIG. 7. Referring to FIGS. 5 and 6, the annealing temperature may be sufficient to diffuse one or more of the elements included in semiconductor layer 16 through a diffusion length at least equal to a quarter of the columnar period $P_2$ (in an economically acceptable time). For example, to diffuse Ge through a diffusion length of at least 1000 nm, the annealing temperature may be at least 1050° C. at a duration of 300,000 sec (83.3 hours). The appropriate annealing temperature may be derived from the equations 1-2 above or FIG. 7. In some embodiments, the duration of the anneal may be selected to be sufficient to diffuse at least one of the at least two elements included in semiconductor layer 16 through a diffusion length at least equal to a quarter of the columnar period $P_2$. For example, to diffuse Ge through a diffusion length of at least 1000 nm, the duration of the annealing may be at least 1200 sec (20 minutes) at a temperature of 1250° C. This duration may be derived from equations 1-2 and/or FIG. 7.

Referring to FIGS. 3, 5, and 6, in some embodiments, semiconductor layer 16 is annealed at an annealing temperature greater than a deposition temperature of semiconductor layer 16. For example, the annealing temperature may be greater than about 800° C., or greater than about 1000° C. The annealing temperature may also be less than a melting point of semiconductor layer 16. For example, for semiconductor layer 16 including Si$_{0.8}$Ge$_{0.2}$, the annealing temperature may be less than about 1270° C. A dislocation density in semiconductor layer 16 may remain substantially unchanged during the annealing step.

Referring to FIG. 6, after an annealing step, semiconductor layer 16 has a relatively homogeneous compositional distribution. Top surface 32 of semiconductor layer 16 may be planarized. This planarization may be performed before, during, or after the annealing step. Planarization may be performed by one of several methods, including CMP, plasma planarization, wet chemical etching, gas-phase chemical etching (preferably at elevated temperature, e.g., above 900° C., in an ambient including an etch species, e.g., HCl), oxidation followed by stripping, and cluster ion beam planarization. In some embodiments, CMP includes a first (stock) and a second (final) step. The stock polish removes a larger fraction of the total amount of material to be removed (~0.5 µm) and leaves a semi-polished surface. The final polish step removes a smaller fraction of the total amount of material to be removed (<0.1 microns) and produces a smooth polished surface. Semiconductor layer 16 may be annealed before or after the first CMP step. The anneal step may provide a greater benefit in terms of layer homogenization, but at perhaps higher cost, if it is inserted between two steps of the planarization process, e.g., between the stock and final polishing steps. The removal of the cross-hatch by the stock polish step before the anneal step may allow the threading dislocations to move more freely to the wafer edge during the anneal. Performing the final polish step after the anneal may be preferable for obtaining a smooth surface for the regrowth process (see, e.g., FIG. 7). The anneal may be performed as a batch process on multiple wafers at once, for example, in a tube furnace, to improve throughput and economics.

Figure 7:
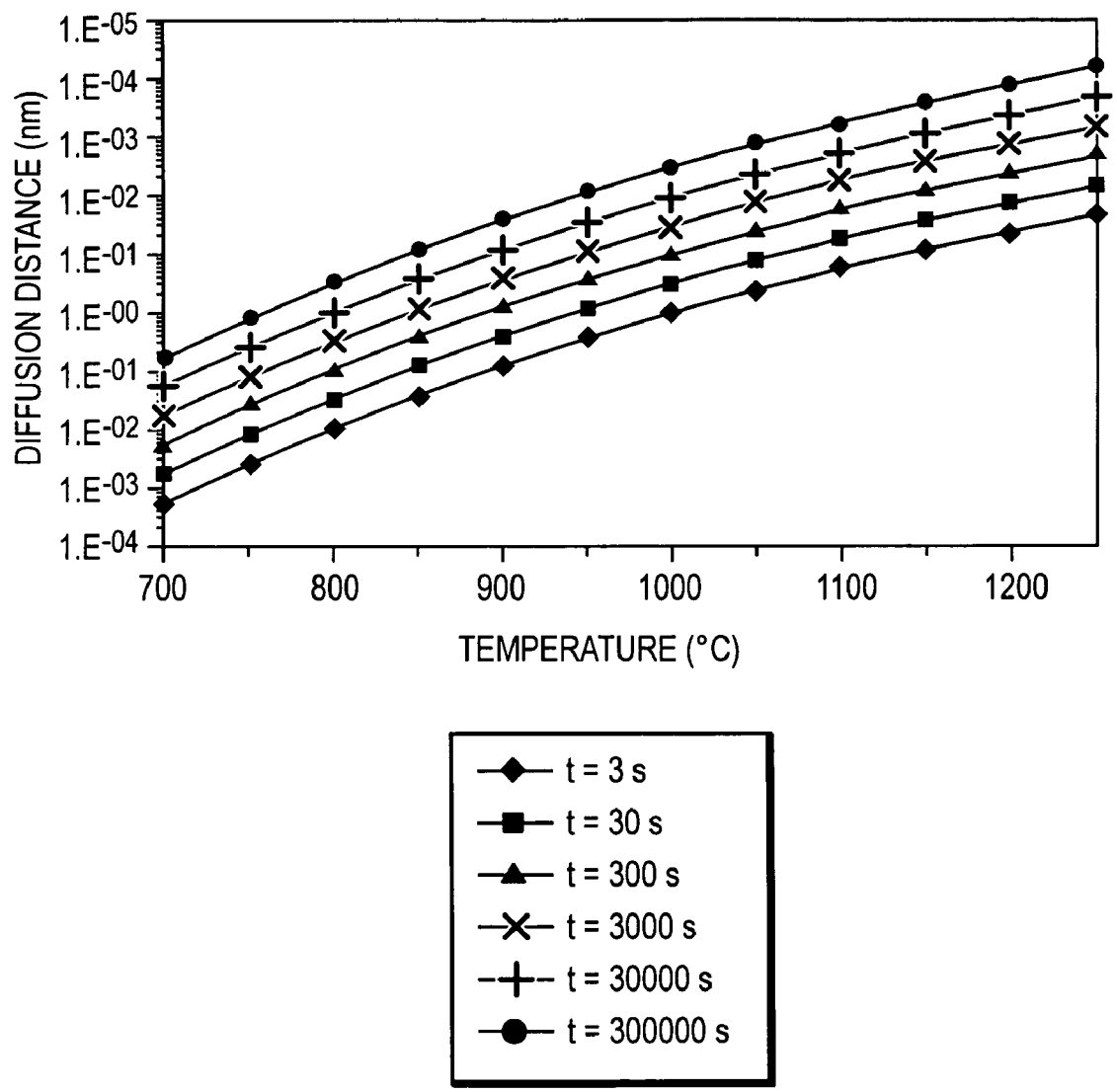
FIG. 7 is a diagram illustrating the temperature and time dependence of diffusion of Ge in Si.
Figure 8:
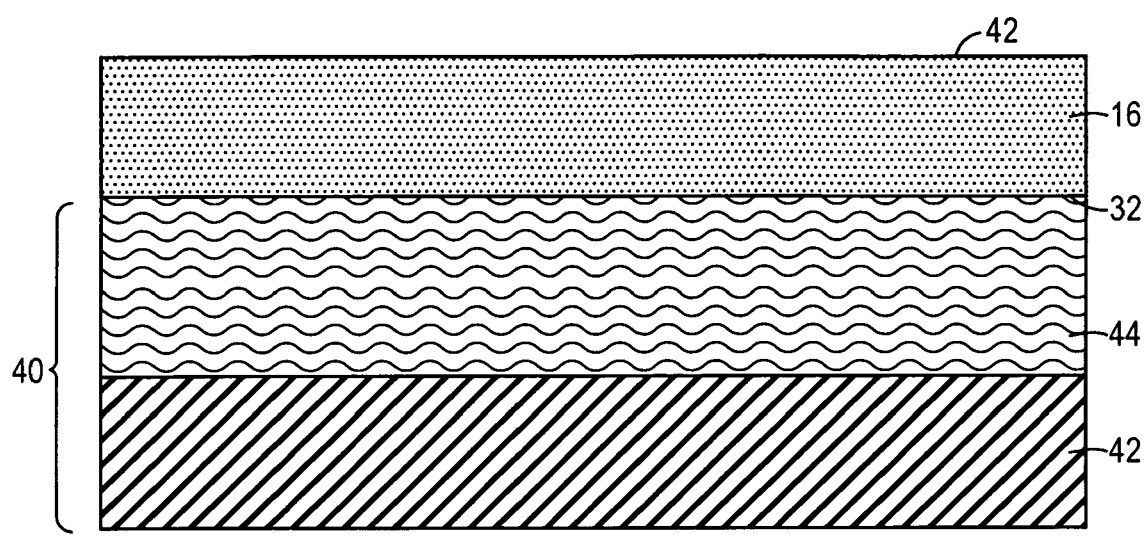

Referring to FIG. 8 as well as to FIG. 7, after planarization, top surface 32 of semiconductor layer 16 may be bonded to a wafer 40. Subsequently, at least a portion of substrate 12 may be removed by, e.g., a wet etch step or a delamination process. After the removal of at least the portion of substrate 12, at least a portion of semiconductor layer 16 remains bonded to the wafer 40. In an embodiment, all of substrate 12 may be removed, and the semiconductor layer 16 may have a second substantially haze-free top surface 42. Second top surface 42 may be planarized (i.e., smoothed) after removal of substrate 12. Planarizing may include chemical-mechanical polishing, plasma planarization, wet chemical etching, gas-phase chemical etching (preferably at elevated temperature, e.g., above 900° C., in an ambient including an etch species, e.g., HCl), oxidation followed by stripping, and/or cluster ion beam planarization. Wafer 40 may include a second substrate 42 formed of a semiconductor, such as Si, Ge, or SiGe. Second substrate 42 may also be formed of an insulating material such as sapphire (Al$_2$O$_3$) or glass. Wafer 40 may also include an insulating layer 44 disposed over substrate 42 and formed from, e.g., silicon dioxide. This process may be used to, e.g., prepare a semiconductor-on-insulator (SOI) substrate or an SSOI substrate.

Figure 9:
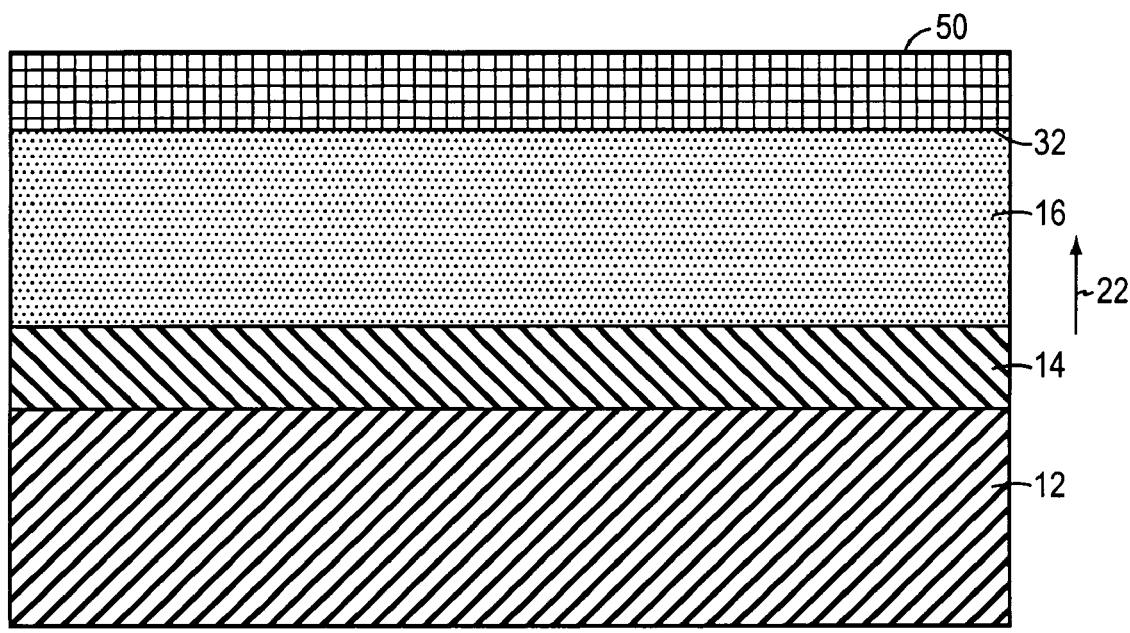

Referring to FIGS. 7 and 9, after planarization of top surface 32 of semiconductor layer 16, a second layer 50 may be formed over semiconductor layer 16. Second layer 50 may include, e.g., a semiconductor material including at least one of a group II, a group III, a group IV, a group V, and a group VI element, and may be formed by, e.g., CVD. Second layer 50 may have a lattice constant substantially equal to a lattice constant of semiconductor layer 16. Second layer 50 may also be a regrowth layer formed from the same material as semiconductor layer 16. Alternatively, the lattice constant of second layer 50 may be substantially different from the lattice constant of semiconductor layer 16. The lattice constant of second layer 50 may be less than that of semiconductor layer 16, in which case second layer 50 may be tensilely strained. For example, semiconductor layer 16 may include $Si_{1-x}Ge_x$ and second layer 50 may include $Si_{1-z}Ge_z$, with z<x. In another embodiment, the lattice constant of second layer 50 may be greater than the lattice constant of semiconductor layer 16, in which case second layer 50 will be compressively strained. For example, semiconductor layer 16 may include $Si_{1-x}Ge_x$ and second layer 50 may include $Si_{1-z}Ge_z$, with z>x. A top surface of second layer 50 may be bonded to wafer 40. Subsequently, at least a portion of substrate 12 may be removed by, e.g., a wet etch step or a delamination process. After the removal of at least the portion of substrate 12, at least a portion of the second layer 50 remains bonded to wafer 40. This process may be used to, e.g., prepare a SOI substrate or a SSOI substrate.

Referring again to FIG. 6, after annealing and planarization, top surface 32 of semiconductor layer 16 is substantially haze-free. Haze is caused by background scattering of a surface, and is directly proportional to the roughness of the surface. Surface roughness may include features on several different spatial wavelengths. The cross-hatch features may typically be several micrometers (e.g., 1 µm-10 µm) in wavelength, while a fine-scale roughness may also be present on a shorter length scale (<1 µm). Surface roughness may be measured by atomic force microscopy (AFM), with a tool like the Dimension 3100 from Veeco Instruments, Woodbury, N.Y.) Haze may be measured by a light-scattering tool, such as various models of the SURFSCAN tool manufactured by KLA-Tencor, San Jose, Calif. or the Film Inspection Tool (FIT)/Advanced Wafer Inspection System (AWIS) manufactured by ADE Corporation, Westwood, Mass. In such laser-based particle or defect detection systems for semiconductor wafers, surface roughness causes may cause light scattering, which is termed "haze." The optical architecture of the system, i.e., the wavelength of the laser, the incident beam angle, and the polar and azimuthal angles of the collection detector(s) determines the spatial wavelengths of roughness to which the system is sensitive. For example, the SURFSCAN 6220, SURFSCAN SP1-TBI dark-field narrow channel with normal incidence beam (DNN), and ADE FIT/AWIS front channel are sensitive primarily to surface roughness features with a wavelength of ~1-10 microns, which corresponds to the cross-hatch feature. In contrast, the SURFSCAN SP1-TBI dark-field wide channel with normal incidence (DWN), the ADE FIT/AWIS back and center channels, and SURFSCAN SP1 dark-field narrow channel with oblique incidence (DNO) are primarily sensitive to surface features with a spatial wavelength of <1 µm, which corresponds to fine-scale roughness. Lower haze values indicate smoother (lower roughness) surfaces, which are generally preferred. Haze values measured by a SURF-SCAN 6220 for a high-quality surface are preferably less than 20 parts per million (ppm), more preferably less than 5 ppm, and most preferably less than 1 ppm. Haze values measured by the ADE FIT/AWIS back and center channels or by the SURFSCAN SP1-TBI DNO channel are preferably less than 0.2 ppm and more preferably less than 0.05 ppm.

By annealing semiconductor layer 16, the compositional variation is homogenized. This uniform composition enables the planarization of top surface 32, as well as cleaning of top surface 32, without the re-introduction of roughness. Top surface 32 of semiconductor layer 16 may, therefore, be both smooth and clean. For example, top surface 32 may have a roughness root-mean-square (RMS) of less than 5 Å (in a 40 µm×40 µm scan area), less than 1 Å (in a 1 µm×1 µm scan area) and a contamination level of less than 0.29 particles per square centimeter ($cm^2$), with respect to particles having a diameter greater than 0.12 µm. This contamination level is equivalent to less than 90 localized light-scattering (LLS) defects greater than 0.12 µm on a 200 millimeter (mm) wafer. The roughness of top surface 32 may be less than 1 Å RMS in a 1 µm×1 µm scan area. Further, top surface 32 of semiconductor layer 16 may have the following roughness and contamination levels:

| Roughness root-mean-square | contamination level |
|---|---|
| <5 Å (40 µm × 40 µm scan area) | <0.16 particles/cm² |
| <1 Å (1 µm × 1 µm scan area) | particle diameter >0.16 µm (<50 LLS defects on a 200 mm wafer) |
| <5 Å (40 µm × 40 µm scan area) | <0.08 particles/cm² |
| <1 Å (1 µm × 1 µm scan area) | particle diameter >0.2 µm (<25 LLS defects on a 200 mm wafer) |
| <5 Å (40 µm × 40 µm scan area) | <0.019 particles/cm² |
| <1 Å (1 µm × 1 µm scan area) | particle diameter >1.0 µm (<6 LLS defects on a 200 mm wafer) |
| <3 Å (40 µm × 40 µm scan area) | <0.09 particles/cm² |
| <0.5 Å (1 µm × 1 µm scan area) | particle diameter >0.09 µm |

The embodiments discussed above illustrate instances in which an annealing step helps eliminate superlattices, thereby reducing surface roughness. In some embodiments, however, an anneal can help reduce haze and provide a smoother layer surface even for layers which are initially homogeneous, i.e., do not have superlattice or columnar compositional variations.

In some embodiments, growth conditions, including a first plurality of parameters may be selected to prevent compositional superlattice formation, thereby eliminating the need for the aforementioned anneal. The first plurality of parameters may include temperature, precursor, growth rate, and pressure. For example, a superlattice-free SiGe graded buffer layer may be grown at high temperatures under the following conditions:

System: ASM EPSILON® 2000 epitaxial reactor, manufactured by ASM International B.V., based in Bilthoven, the Netherlands
Temperature: 1000-1100° C.
Pressure: 20 Torr to 760 Torr (atmospheric pressure)
Hydrogen flow: 20-80 standard liters per minute (slm)
Dichlorosilane flow: 50-250 standard cubic centimeters per minute (sccm)
Germanium tetrachloride flow: 0-0.5 gram per minute
Growth rate: 380-980 nm/min In a preferred embodiment, conditions for growth of a superlattice-free graded SiGe buffer layer may be as follows:
System: ASM EPSILON® 2000 epitaxial reactor
Temperature: 1100° C.
Pressure: 80 Torr
Hydrogen flow: 40 slm
Dichlorosilane flow: 250 sccm
Germanium tetrachloride flow: 0-0.5 gram per minute (for up to 20% Ge)
Growth rate: 850-980 nm/min The presence or absence of a superlattice in a regrowth layer, e.g., a SiGe layer, formed after the planarization step should also be considered. Such a superlattice may be detrimental to the electrical properties of the semiconductor layer grown on it, e.g., a strained Si layer. In some embodiments, regrowth may be performed without forming a superlattice structure. Factors that reduce variation in a gas phase depletion profile in, e.g., a SiGe deposition system (and therefore also reduce upstream-to-downstream SiGe compositional variations) tend to reduce a tendency to define a superlattice in the SiGe layer. These factors include, for example, reduced dichlorosilane (DCS) or equivalent Si precursor flow/growth rate, decreased temperature, and increased hydrogen flow rates. Conditions that produce a difference of less than 5%, and preferably less than 2%, in the Ge fraction between the upstream and downstream positions on a wafer having a diameter of 200 millimeters (mm) or less may produce superlattice-free growth. A wafer having a diameter larger than 200 mm, e.g., 300 mm or larger, may require even less difference in the Ge fraction to achieve superlattice-free growth, e.g., possibly less than 2% variation. The effect of the conditions may be measured by growing a wafer without rotation and measuring upstream and downstream positions on the wafer near the wafer edge (<10 mm from a wafer edge, preferably <5 mm from the wafer edge).

Figure 10:
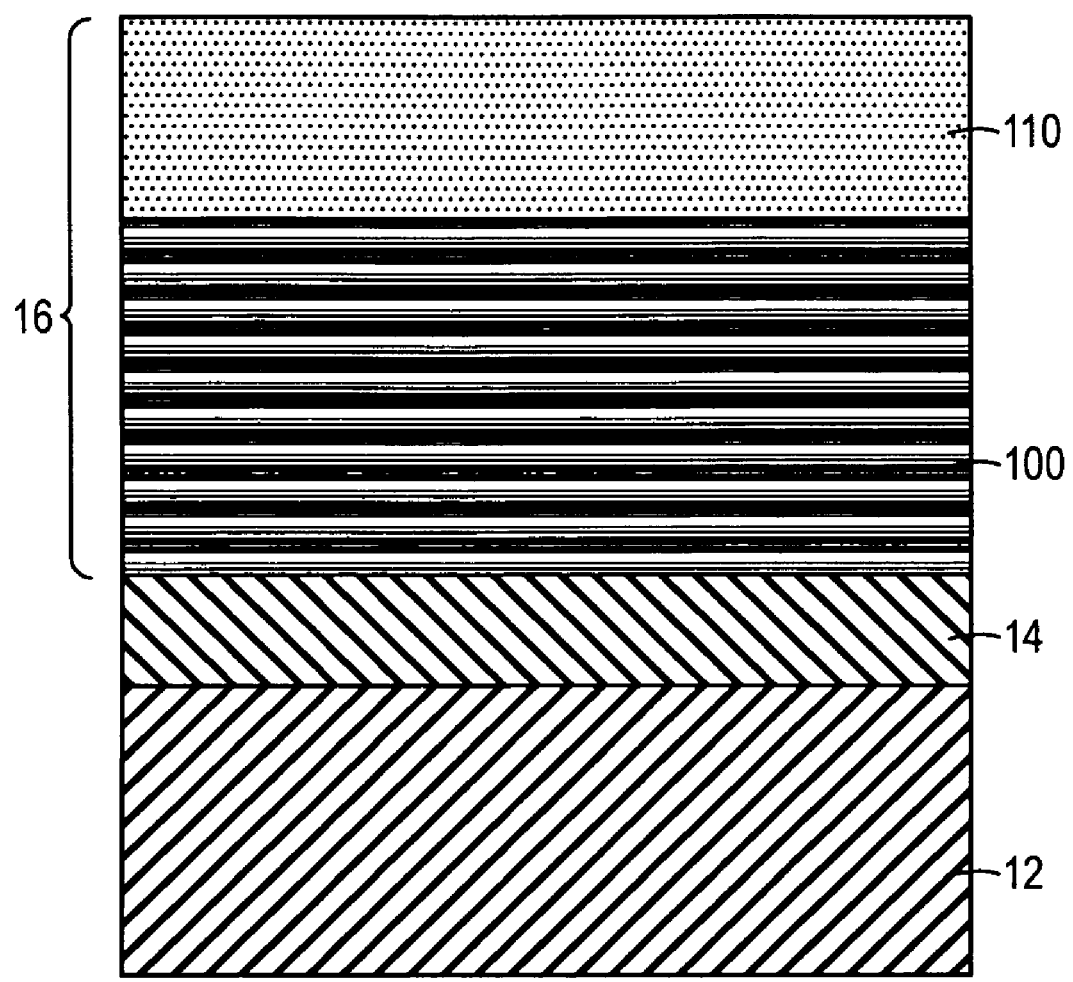

Like for the semiconductor layer, the regrowth layer may be formed substantially haze-free, and may include two elements, the two elements being distributed to define a compositional variation within the semiconductor layer. A second plurality of parameters may be used for forming the regrowth layer. These parameters may include a second temperature, with the first temperature used to make the semiconductor layer being higher than the second temperature. As an example, superlattice-free regrowth of SiGe layers may be achieved in an ASM EPSILON® 2000 epitaxial reactor under the following representative conditions:

Temperature: 700-850° C.
Pressure: 20-80 Torr
$H_2$ flow: 20-80 slm
Dichlorosilane flow: 20-60 sccm
Germane ($GeH_4$) flow: 8-34 sccm of 25% $GeH_4$
Growth rate: 20-200 nm/min In a preferred embodiment, conditions for superlattice-free regrowth of SiGe layers may be as follows:

Temperature: 750-800° C.
Pressure: 80 Torr
$H_2$ flow: 40-80 slm
Dichlorosilane flow: 50 sccm
Germane flow: 17-34 sccm of 25% $GeH_4$
Growth rate: 90-100 nm/min Referring to FIG. 10, in an alternative embodiment, the semiconductor layer 16 may have a lower portion 100 that includes a superlattice and an upper portion 110 disposed over the lower portion 100 that is substantially free of a superlattice. The superlattice of the lower portion 100 may help block the effects of an underlying misfit array, thereby enabling the suppression of the reappearance of cross-hatch during subsequent regrowth or post-planarization anneal steps.

Figure 11:
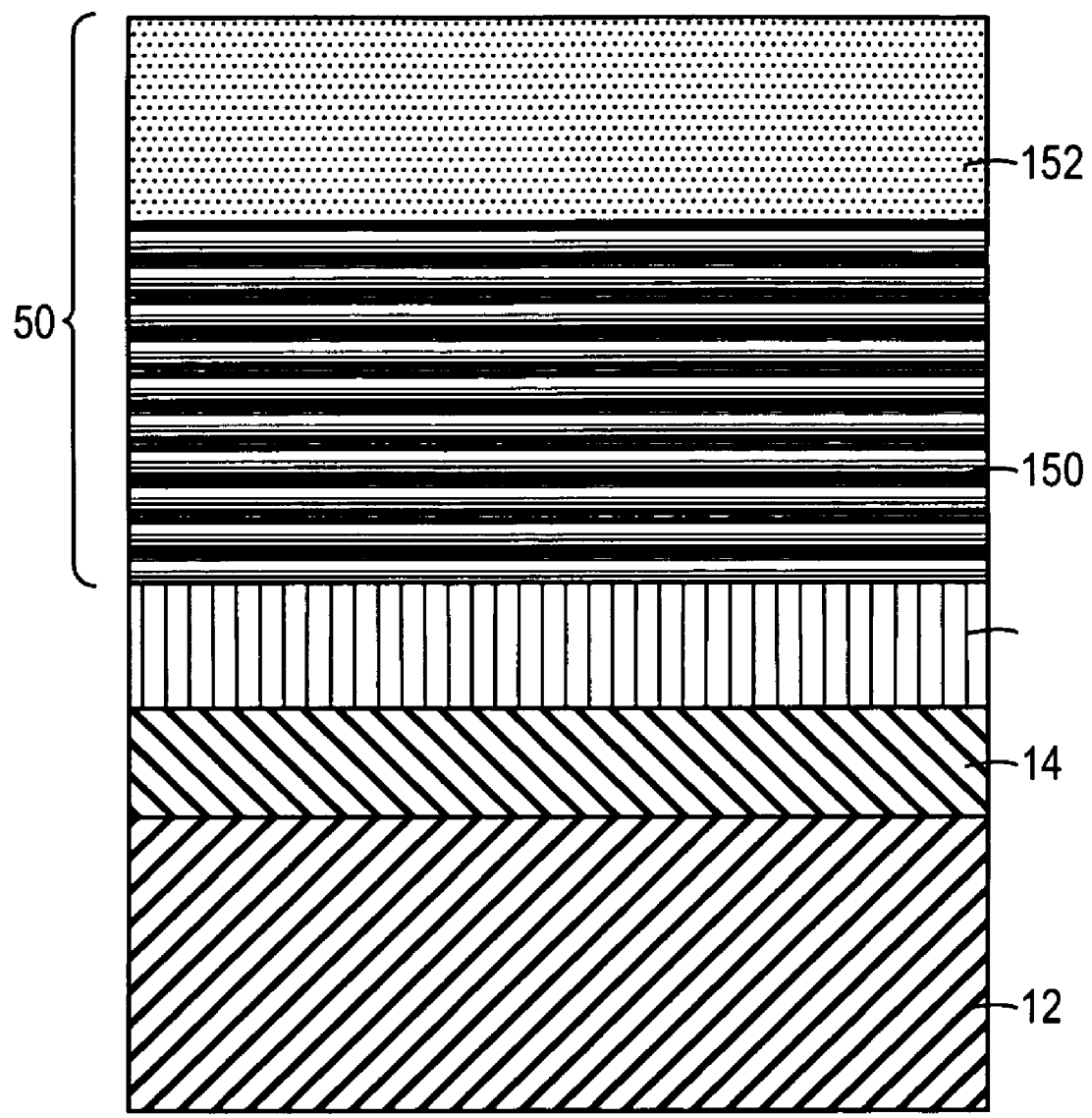

Referring to FIG. 11, in an embodiment, second layer 50 disposed over semiconductor layer 16 may be a regrowth layer having a lower portion 150 that includes a superlattice and an upper portion 152 that is substantially free of a superlattice. Performing the initial portion of the regrowth under conditions that promote the presence of the superlattice may block strain fields from an underlying misfit array. This enables suppression of the reappearance of the cross-hatch during the regrowth process or post-planarization anneal steps. A final portion of the regrowth can be performed using superlattice-free conditions as outlined above such that the final strained Si device layer is not in proximal contact with a region having a superlattice.

In some embodiments, a "buried" region may have a superlattice, e.g., lower portion 150 of regrowth second layer 50 or lower portion 100 of semiconductor layer 16, that may be annealed away after completion of epitaxial steps.

ILLUSTRATIVE EMBODIMENTS

Experimental Set 1

The following two SiGe relaxed buffer layer samples were analyzed with and without annealing:
1. Sample A: Non-annealed test wafer subjected to x-ray diffraction (XRD) measurement. The Ge composition was determined to be 29.5±0.3%, with relaxation of 95.5±1%.
2. Sample B: wafer whose Ge content was made more uniform by annealing. After deposition, the wafer was annealed in the same deposition chamber at 1050° C. for 5 minutes.

AFM analysis was conducted for samples A and B at different scan sizes (1 µm×1 µm, 10 µm×10 µm, and 50 µm×50 µm). Referring to Table 1, roughness values [RMS and $R_a$ (average roughness)] were obtained. Surface roughness increased by an average of about 20% after annealing, based on large scan sizes, i.e., 10 µm×10 µm and 50 µm×50 µm. Scans of a given size can capture roughness with wavelengths less than the scan size, but not larger. However, characteristic RMS values represent only the wavelength with the largest amplitude, i.e., the long wavelength. The layers in samples A and B do not exhibit columnar decomposition. Cross-hatch roughness, i.e., waviness, increases because of the thermal annealing of the sample. The cross-hatch does not correspond to the columnar decomposition; rather, it ultimately arises from the influence of the strain fields of the buried misfit dislocations in the graded layer. Annealing may cause the cross-hatch to reappear even after the layer has been polished because the surface atom mobility may be high at high temperatures. Because the buried misfit dislocations are still present below the surface, the atoms on the surface may start to rearrange under the influence of the misfit dislocation strain fields, bringing back a milder version of the original cross-hatch. On the other hand, based on the small scan size that captures the short wavelength roughness (<1 µm), the short wavelength roughness decreased by a factor of approximately seven. This significant reduction in the short wavelength roughness reduces the haze level observed on wafers annealed like sample B.

In some cases, annealing may reduce the short wavelength roughness and the associated haze level of a layer, but may increase the large wavelength roughness (e.g., the cross-hatch roughness). Therefore, it may be advantageous to perform the annealing step prior to planarization. In this manner, the anneal reduces the propensity of the short wavelength roughness to reappear in subsequent processing steps, and the planarization step reduces any long wavelength roughness that reappeared during annealing. Because the re-emergence of the long wavelength roughness results from high surface atom mobility and from atoms responding to underlying strain fields below the surface, low long scale roughness may be maintained during the annealing step in other ways. In order to reduce the surface mobility of atoms in a layer, the layer may be capped by a protective layer. This protective layer may include material that will not react with the surface being protected and that is easily removed selectively to the underlying surface. Suitable material for the protective layer may be, for example, silicon dioxide ($SiO_2$) or silicon nitride ($Si_3N_4$). The presence of the protective layer decreases the mobility of atoms in the layer to be annealed, since the atoms no longer lie atop a free surface. Thus, if additional planarization is not desirable after the anneal, protective layers may be utilized to prevent the re-emergence of long wavelength surface roughness.

TABLE 1

Roughness of samples A and B at different scan sizes

| Sample ID | 1 × 1 μm scan | | 10 × 10 μm scan | | 50 × 50 μm scan | |
|---|---|---|---|---|---|---|
| | RMS (nm) | $R_a$ (nm) | RMS (nm) | $R_a$ (nm) | RMS (nm) | $R_a$ (nm) |
| A (not annealed) | 0.700 | 0.588 | 0.956 | 0.774 | 2.622 | 1.974 |
| B (annealed) | 0.103 | 0.083 | 1.151 | 0.945 | 3.471 | 2.213 |

Experimental Set 2

In second experiment, a SiGe graded buffer layer grown at >850° C. was annealed at 1050° C. for 5 minutes at atmospheric pressure in hydrogen. Before and after the annealing, the surface roughness was measured by AFM with different scan sizes (1×1 μm, 10×10 μm, and 50×50 μm) at the center, mid-radius, and edge of the wafer. In addition, haze measurements using a laser defect scanner (SURFS-CAN 6220, available from KLA-Tencor) were compared between equivalent buffer layers, one unannealed and the other annealed. Referring to Table 2, the short spatial wavelength surface roughness derived from the 1 μm×1 μm scan decreased after the anneal by an average of about 50%. AFM images (50 μm×50 μm, 10 μm×10 μm, and 1 μm×1 μm) at the edge of the wafer were compared before and after anneal. The number of periods in the cross-hatch roughness decreased after the anneal.

TABLE 2

Roughness of samples A and B at different scan sizes

| Scan dimension & position | Pre-anneal | | Post-anneal | |
|---|---|---|---|---|
| | $R_a$ | RMS | $R_a$ | RMS |
| 50 μm - edge | 5.766 | 4.612 | 5.322 | 7.047 |
| 10 μm - edge | 4.119 | 3.318 | 2.643 | 3.320 |
| 1 μm - edge | 0.730 | 1.463 | 0.210 | 0.266 |
| | 0.434 | 0.543 | 0.383 | 0.922 |
| | 0.508 | 0.640 | 0.274 | 0.300 |
| 50 μm - mid-radius | 5.588 | 4.560 | 3.942 | 4.950 |
| 10 μm - mid-radius | 3.446 | 2.839 | 2.964 | 4.041 |
| 1 μm - mid-radius | 0.574 | 0.454 | 0.274 | 0.340 |
| 50 μm - center | 6.189 | 4.957 | 3.641 | 4.689 |
| 10 μm - center | | | 2.964 | 3.490 |
| 1 μm - center | 0.669 | 0.584 | 0.257 | 0.311 |

Laser Particle Scanner—Haze

Surface roughness has a significant impact on the characterization of the buffer layers by laser particle scanning, e.g., with a Tencor SURFSCAN 6220. Higher roughness is observed as elevated haze levels, making detection of small particles difficult. For this reason, one of the key measurements indicating the effect of a process is the measurement of haze levels on the wafers.

Haze level measurements were made before and after the anneal of wafers having equivalent buffer layers. The haze levels of non-annealed and annealed wafers were compared, with wafers placed in the inspection tool in the "notch down" (0 degree rotation) orientation. Haze is measured as a fraction of light energy scattered by the surface relative to the energy in the incident laser beam. The haze level was reduced by 50% or more by the anneal, confirming the reduction of small scale roughness shown in the AFM data.

Another aspect of the effect of the anneal process on the wafer surface roughness and resulting haze measurement is the greater extent to which the haze of an annealed substrate is reduced by changing the orientation angle. Because fine scale roughness has a more random orientation than cross-hatch, the scattering characteristics of fine scale roughness do not depend on the orientation of the wafer in relation to the incident beam. The cross-hatch, in contrast, scatters the incident beam in a different direction depending on the orientation angle of the wafer.

Annealing the substrate increases the impact of the orientation angle on haze. Before an anneal, changing the orientation angle of the wafer (0 to 45 degrees) in the inspection system reduces the measured haze by only about 10%, e.g., the average haze measurement is reduced from 716 to 657 ppm. After the anneal, the random, fine scale roughness is reduced, and the haze is reduced by 50% when the orientation angle is changed from 0 to 45 degrees.

Reduction of Vertical Superlattice Structure

A vertical superlattice, i.e., a vertical variation in the composition of the SiGe, has been observed in SiGe buffer layers.

X-ray diffraction (XRD) scans of buffer layer 14 provided evidence of the presence or absence of superlattices in buffer layers before and after anneal. XRD rocking curves were generated of a SiGe buffer layer 14 without an anneal and with an anneal for 1050° C. for 5 minutes. Satellite peaks around the normal graded buffer signature (peaks at −3500 to −3000 arc-sec, and at +700 to +1000 arc-sec indicated the presence of the superlattice structure in buffer layer 14 that has not been annealed. The peaks were observed at the wafer edge, possibly due to the wafer edge alternating as a leading and trailing edge due to wafer rotation in a horizontal flow reactor. The satellite peaks were not present, neither at the center nor at the edge of the wafer, in a SiGe graded buffer layer 14 that has been annealed.

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A method for forming a semiconductor substrate, the method comprising:
   providing a substrate;
   forming a semiconductor layer over a top surface of the substrate, the semiconductor layer including at least two elements, the elements being distributed to define an initial compositional variation within the semiconductor layer;
   annealing the semiconductor layer to reduce the initial compositional variation;
   planarizing a top surface of the semiconductor layer;
   forming a second layer over the semiconductor layer subsequent to planarizing the top surface of the semiconductor layer;
   bonding a top surface of the second layer to a wafer; and removing at least a portion of the substrate,
wherein at least a portion of the second layer remains bonded to the wafer after the portion of the substrate is removed.

2. The method of claim 1 wherein a first element has a first concentration, a second element has a second concentration, and each of the first and second concentrations is at least 5%.

3. The method of claim 1 wherein the initial compositional variation varies periodically within the semiconductor layer in a direction perpendicular to a semiconductor layer deposition direction.

4. The method of claim 3 wherein the compositional variation defines a column within the semiconductor layer, the column having a width and a period.

5. The method of claim 4 wherein the columnar period is less than approximately 2000 nanometers.

6. The method of claim 5 wherein the columnar period is less than approximately 1000 nanometers.

7. The method of claim 4 wherein the semiconductor layer is annealed at an annealing temperature sufficient to diffuse at least one of the two elements through a diffusion length at least equal to a quarter of the columnar period.

8. The method of claim 4 wherein the semiconductor layer is annealed for a duration sufficient to diffuse at least one of the two elements through a diffusion length at least equal to a quarter of the columnar period.

9. The method of claim 1 wherein the initial compositional variation varies in a direction parallel to a semiconductor layer deposition direction and defines a superlattice having a periodicity.

10. The method of claim 9 wherein the superlattice periodicity is less than approximately 100 nanometers.

11. The method of claim 10 wherein the superlattice periodicity is less than approximately 50 nanometers.

12. The method of claim 11 wherein the superlattice periodicity is less than approximately 10 nanometers.

13. The method of claim 9 wherein the semiconductor layer is annealed at an annealing temperature sufficient to diffuse at least one of the two elements through a diffusion length at least equal to a quarter-period of the superlattice.

14. The method of claim 9 wherein the semiconductor layer is annealed for a duration sufficient to diffuse at least one of the two elements through a diffusion length at least equal to a quarter-period of the superlattice.

15. The method of claim 1 wherein one of the at least two elements comprises silicon.

16. The method of claim 1 wherein one of the at least two elements comprises germanium.

17. The method of claim 1 wherein the top surface of the semiconductor layer is planarized before the semiconductor layer is annealed.

18. The method of claim 1 wherein the top surface of the semiconductor layer is planarized while the semiconductor layer is annealed.

19. The method of claim 1 wherein planarizing comprises at least one of chemical-mechanical polishing, plasma planarization, wet chemical etching, gas-phase chemical etching, oxidation followed by stripping, and cluster ion beam planarization.

20. The method of claim 19 wherein chemical-mechanical polishing comprises a first and a second step and the semiconductor layer is annealed between the first and the second chemical-mechanical polishing steps.

21. The method of claim 19 wherein chemical-mechanical polishing comprises a first and a second step and the semiconductor layer is annealed before the first chemical-mechanical polishing step.

22. The method of claim 19 wherein planarizing comprises a high temperature step and the semiconductor layer is annealed during the high temperature planarization step.

23. The method of claim 1 wherein the second layer comprises a material having a lattice constant substantially equal to a lattice constant of the semiconductor layer.

24. The method of claim 1 wherein the second layer comprises a material having a lattice constant substantially different from a lattice constant of the semiconductor layer.

25. A method for forming a semiconductor structure, the method comprising:
providing a substrate;
selecting a first plurality of parameters suitable for forming a semiconductor layer over a top surface of the substrate, the semiconductor layer including at least two elements, the elements being distributed to define a compositional variation within the semiconductor layer;
forming the semiconductor layer having a haze; and
planarizing the semiconductor layer to remove the haze,
wherein the haze comprises a fine-scale roughness wavelength of <1 micrometer.

26. The method of claim 25 wherein forming the semiconductor layer comprises forming a lower portion including a superlattice and forming an upper portion over the lower portion, the upper portion being substantially free of a superlattice.

27. The method of claim 25 wherein the first plurality of parameters comprises at least one parameter selected from the group consisting of temperature, precursor, growth rate, and pressure.

28. The method of claim 25, further comprising:
cleaning the semiconductor layer after planarizing,
wherein the semiconductor layer remains substantially haze-free after cleaning.

29. The method of claim 25, further comprising:
selecting a second plurality of parameters suitable for forming a substantially haze-free regrowth layer over the semiconductor layer, the semiconductor layer including at least two elements, the elements being distributed to define a compositional variation within the semiconductor layer; and
forming the substantially haze-free regrowth layer.

30. The method of claim 29 wherein the first plurality of parameters comprises a first temperature, the second plurality of parameters comprises a second temperature, and the first temperature is higher than the second temperature.

31. The method of claim 29 wherein the first plurality of parameters comprises a first growth rate, the second plurality of parameters comprises a second growth rate, and the first growth rate is higher than the second growth rate.

32. The method of claim 29 wherein forming the regrowth layer comprises forming a lower portion including a superlattice and forming an upper portion over the lower portion, the upper portion being substantially free of a superlattice.

33. The method of claim 25, wherein after planarization, a top surface of the semiconductor layer has a roughness root-mean-square of less than 5 angstroms in a scan area of 40 µm×40 µm.

34. The method of claim 33, wherein after planarization, the semiconductor layer top surface has a roughness root-mean-square of less than 1 angstrom in a scan area of 40 µm ×40 µm.

* * * * *